United States Patent
Hirosaki et al.

(10) Patent No.: US 9,534,171 B2
(45) Date of Patent: Jan. 3, 2017

(54) PHOSPHOR, METHOD FOR PRODUCING SAME, LIGHT EMITTING DEVICE, AND IMAGE DISPLAY DEVICE

(71) Applicant: National Institute for Materials Science, Ibaraki (JP)

(72) Inventors: Naoto Hirosaki, Ibaraki (JP); Takashi Takeda, Ibaraki (JP); Shiro Funahashi, Ibaraki (JP); Eiichirou Narimatsu, Ibaraki (JP)

(73) Assignee: National Institute for Materials Science, Tsukuba-Shi (JP)

( * ) Notice: Subject to any disclaimer, the term of this patent is extended or adjusted under 35 U.S.C. 154(b) by 99 days.

(21) Appl. No.: 14/410,822

(22) PCT Filed: Jun. 26, 2013

(86) PCT No.: PCT/JP2013/067571
§ 371 (c)(1),
(2) Date: Dec. 23, 2014

(87) PCT Pub. No.: WO2014/003076
PCT Pub. Date: Jan. 3, 2014

(65) Prior Publication Data
US 2015/0146408 A1 May 28, 2015

(30) Foreign Application Priority Data
Jun. 27, 2012 (JP) ................. 2012-143892

(51) Int. Cl.
*C09K 11/64* (2006.01)
*C09K 11/08* (2006.01)
(Continued)

(52) U.S. Cl.
CPC ........ *C09K 11/7792* (2013.01); *C09K 11/0883* (2013.01); *C09K 11/7706* (2013.01);
(Continued)

(58) Field of Classification Search
CPC ................................. C09K 11/7734
See application file for complete search history.

(56) References Cited

U.S. PATENT DOCUMENTS

2006/0192178 A1 8/2006 Hirosaki
2007/0007494 A1 1/2007 Hirosaki et al.
(Continued)

FOREIGN PATENT DOCUMENTS

JP    A 2005112922 A    4/2005
JP    B3668770    4/2005
(Continued)

*Primary Examiner* — Carol M Koslow
(74) *Attorney, Agent, or Firm* — Trojan Law Offices

(57) ABSTRACT

To provide a phosphor being chemically-thermally stable and having high luminous intensity if combined with LED of not exceeding 470 nm. A phosphor of the present invention includes: inorganic compound including: a crystal represented by $Li_1Ba_2Al_1Si_7N_{12}$; a crystal represented by $(Li, A)_3(D, E)_8X_{12}$; and an inorganic crystal having the same crystal structure as the crystal represented by $Li_1Ba_2Al_1Si_7N_{12}$; and a solid-solution crystal thereof, which contains Li, A, D, E, and X elements (A represents at least one selected from Mg, Ca, Sr, Ba, Sc, Y and La; D represents at least one selected from Si, Ge, Sn, Ti, Zr and Hf; E represents at least one selected from B, Al, Ga and In; and X represents at least one selected from O, N and F), wherein M element (M represents at least one selected from Mn, Ce, Pr, Nd, Sm, Eu, Tb, Dy and Yb) is solid-solved into each.

35 Claims, 5 Drawing Sheets

Crystal structure of $LiBa_2AlSi_7N_{12}$

(51) Int. Cl.
    *C09K 11/59*     (2006.01)
    *C09K 11/79*     (2006.01)
    *C09K 11/80*     (2006.01)
    *H01L 33/50*     (2010.01)
    *H01J 1/63*     (2006.01)
    *C09K 11/77*     (2006.01)
    *H01L 51/52*     (2006.01)
    *H01S 5/10*     (2006.01)

(52) U.S. Cl.
    CPC ...... *C09K 11/7721* (2013.01); *C09K 11/7728* (2013.01); *C09K 11/7734* (2013.01); *H01L 33/502* (2013.01); *H01L 51/52* (2013.01); *H01S 5/10* (2013.01); *H01L 2224/45144* (2013.01); *H01L 2224/48091* (2013.01); *H01L 2224/48247* (2013.01); *H01L 2224/8592* (2013.01); *H01L 2924/12044* (2013.01); *H01L 2924/181* (2013.01)

(56) References Cited

U.S. PATENT DOCUMENTS

| | | |
|---|---|---|
| 2007/0018567 A1 | 1/2007 | Hirosaki |
| 2007/0108896 A1 | 5/2007 | Hirosaki |
| 2009/0236969 A1 | 9/2009 | Hirosaki |
| 2011/0121234 A1 | 5/2011 | Hirosaki |

FOREIGN PATENT DOCUMENTS

| | | |
|---|---|---|
| JP | B 3668770 B2 | 4/2005 |
| JP | B3837551 | 8/2006 |
| JP | B 3837551 B2 | 8/2006 |
| JP | B 3837588 B2 | 8/2006 |
| JP | B 3921545 B2 | 3/2007 |
| JP | B4524368 | 6/2010 |
| JP | B 4524368 B2 | 6/2010 |
| WO | WO 2005019376 A | 3/2005 |
| WO | WO 2006101096 A | 9/2006 |
| WO | WO 2007066733 A | 6/2007 |

Crystal structure of $LiBa_2AlSi_7N_{12}$

PHOSPHOR, METHOD FOR PRODUCING SAME, LIGHT EMITTING DEVICE, AND IMAGE DISPLAY DEVICE

TECHNICAL FIELD

The present invention relates to a phosphor, a manufacture thereof, and an application thereof, wherein the phosphor comprises: an inorganic compound comprising: a crystal represented (expressed, designated) by $LiBa_2AlSi_7N_{12}$, an inorganic crystal having the same crystal structure as a crystal structure of a crystal represented by $LiBa_2AlSi_7N_{12}$ (for example, a crystal represented by $(Li,A)_3(D,E)_8X_{12}$), or a solid solution crystal of these, which comprises at least a Li element, an A element, a D element, an E element, and an X element (here, A is one or two or more kinds of elements selected from a group consisting of Mg, Ca, Sr, Ba, Sc, Y, and La; D is one or two or more kinds of elements selected from a group consisting of Si, Ge, Sn, Ti, Zr, and Hf; E is one or two or more kinds of elements selected from a group consisting of B, Al, Ga, and In; X is one or two or more kinds of elements selected from a group consisting of O, N, and F), into which an M element is solid-solved (here, M is one or two or more kinds of elements selected from a group consisting of Mn, Ce, Pr, Nd, Sm, Eu, Tb, Dy, and Yb).

BACKGROUND ART

The phosphor is utilized in a fluorescent display tube (VFD: vacuum-fluorescent display), a field emission display (FED: Field Emission Display) or SED (Surface-Conduction Electron-Emitter Display), a plasma display panel (PDP: Plasma Display Panel), a cathode-ray tube (CRT: Cathode-Ray Tube), a liquid-crystal display backlight (Liquid-Crystal Display Backlight), a white light-emitting diode (LED: Light-Emitting Diode), and so on. In any of these applications, it is necessary to provide the phosphor with energy to excite the phosphor in order to make the phosphor emit fluorescence and the phosphor is excited by an excitation source with high energy such as a vacuum ultraviolet ray, an ultraviolet ray, an electron beam, and blue light so as to emit a visible light ray such as blue light, green light, yellow light, orange light, and red light. However, as a result of the phosphor being exposed to such excitation source, the luminance of the phosphor tends to decrease and a phosphor having little degradation in the brightness is desired. Therefore, a phosphor having an inorganic crystal containing nitrogen in a crystal structure thereof as a host crystal, instead a conventional phosphor such as a silicate phosphor, a phosphate phosphor, a aluminate phosphor, and a sulfide phosphor, has been proposed, as exemplified by a sialon phosphor, an oxynitride phosphor, or a nitride phosphor, which is characterized by low brightness deterioration caused by high energy excitation.

An example of the sialon phosphors is manufactured by a manufacturing process as generally described below. First, silicon nitride ($Si_3N_4$), aluminum nitride (AlN), and europium oxide ($Eu_2O_3$) are mixed in predetermined molar ratios and the resultant mixture is fired by a hot press method in one atmospheric pressure (0.1 MPa) of nitrogen atmosphere at 1700° C. for one hour (for example, refer to Patent Reference 1). It was reported that α-sialon activated with an Eu ion ($Eu^{2+}$) manufactured by the above processes had become a phosphor emitting yellow light in a wavelength range of 550 nm to 600 nm if excited by blue light having a wavelength range of 450 to 500 nm. And it is known that an emission wavelength may vary as a ratio of Si to Al or a ratio of oxygen to nitrogen is changed while the α-sialon crystal structure is maintained (refer to Patent References 2 and 3).

As another example of the sialon phosphor, a green phosphor in which β type sialon is activated by $Eu^{2+}$ is known (refer to Patent Reference 4). It is known that, in the phosphor, an emission wavelength thereof may shift to a shorter wavelength by changing the oxygen content while the crystal structure remains the same (for example, refer to Patent Reference 5). Moreover, it is known that a blue phosphor is to be formed when β type sialon is activated by $Ce^{3+}$ (for example, refer to Patent Reference 6).

As an example of an oxynitride phosphor, a blue phosphor having a JEM phase ($LaAl(Si_{6-z}Al_z)N_{10-z}O_z$) as a host crystal, which is activated by Ce (refer to Patent Reference 7), is known. It is known that, in the phosphor, an emission wavelength may shift to a longer wavelength as an excitation wavelength shifts to a longer wavelength by substituting partially La with Ca while the crystal structure is maintained.

As another example of an oxynitride phosphor, a blue phosphor having a La—N crystal $La_3Si_8N_{11}O_4$ as a host crystal, which is activated by Ce, is known (refer to Patent Reference 8).

As an example of the nitride phosphor, a red phosphor having a crystal of $CaAlSiN_3$ as a host crystal, which is activated by $Eu^{2+}$, is known (refer to Patent Reference 9). Color rendering properties of a white LED are improved by utilizing this phosphor. A phosphor to which Ce was added as the activating element was reported to be an orange phosphor.

Thus, an emission color of the phosphor could vary depending on a combination of the crystal to act as the host crystal and a metal ion (activating ion or also referred to as light-emitting ion) being incorporated into the crystal as a solid solution. Further, emission characteristics such as an emission spectrum and an excitation spectrum, chemical stability, or thermal stability could vary depending on the combination of the host crystal and the activating ion such that a phosphor may be regarded as another different phosphor when either host crystal thereof or activating ion thereof is different. Moreover, a material having even the same chemical composition should be regarded as another different phosphor when a crystal structure thereof is different such that the host crystal is different. In this way, the material having a different crystal structure has different emission characteristics or stability.

Further, kinds of constituent elements can be substituted in many phosphors while the same crystal structure of the host crystal is maintained, thereby changing the emission color. For example, although a phosphor having a YAG crystal to which Ce is added emits light of a green color, a phosphor having a YAG crystal in which Y is partially substituted with Gd and Al is partially substituted with Ga exhibits emission of a yellow color. Further, in a phosphor having $CaAlSiN_3$ to which Eu is added, it is known that a composition thereof varies by partially substituting Ca with Sr while the same crystal structure is maintained such that the emission wavelength shifts to a shorter wavelength. In this way, such a phosphor in which element substitution is performed while the same crystal structure is maintained is regarded as a material of the same group.

From the described above, it is important to find a host crystal having a new crystal structure in developing a new phosphor and it is possible to propose a new phosphor by activating such a host crystal with an emission-causing metal ion to make the host crystal exhibit luminescence characteristics.

PRIOR ART REFERENCES

Patent References

[Patent Reference 1] Japanese Patent No. 3668770, Specification.
[Patent Reference 2] Japanese Patent No. 3837551, Specification.
[Patent Reference 3] Japanese Patent No. 4524368, Specification.
[Patent Reference 4] Japanese Patent No. 3921545, Specification.
[Patent Reference 5] International Publication No. WO 2007/066733.
[Patent Reference 6] International Publication No. WO 2006/101096.
[Patent Reference 7] International Publication No. WO 2005/019376.
[Patent Reference 8] Japanese Patent Application Publication No. 2005-112922.
[Patent Reference 9] Japanese Patent No. 3837588, Specification.

SUMMARY OF THE INVENTION

Problem to be Solved by the Invention

The present invention aims to satisfy such demand and it is one of the objects to provide an inorganic phosphor that has emission characteristics (emission color, excitation characteristics, emission spectrum) different from those of a conventional phosphor, exhibits high emission intensity even when combined with an LED with a wavelength of 470 nm or less, and is chemically and thermally stable. It is another object of the present invention to provide a light-emitting device that utilizes such a phosphor and is excellent in durability and an image display device that utilizes such a phosphor and is excellent in durability.

Means to Solve the Problem

Under such a situation, the present inventors have investigated in detail a phosphor having, as a host crystal, a new crystal containing nitrogen and a crystal in which a metal element or N in the crystal structure is substituted by another kind of element, so as to find out that the phosphor may emit fluorescence of blue-to-red color by containing an activating ion in this host crystal wherein the phosphor comprises: a crystal represented by $LiBa_2AlSi_7N_{12}$, an inorganic crystal having the same crystal structure as the crystal structure of the $LiBa_2AlSi_7N_{12}$ crystal, or a solid solution crystal of these, as the host crystal. Further, the present inventors found out that a phosphor having a specific composition emitted a fluorescence of green color having a peak in a wavelength range from at least 500 nm to not exceeding 550 nm, or a fluorescence of red color having a peak in a wavelength range from at least 620 nm to not exceeding 670 nm.

Further, it was found to be possible to obtain a white color light-emitting diode (light-emitting device) with a high emission efficiency and a small temperature fluctuation, an illuminating device with the same diode, and an image display device rendering bright coloring by utilizing such phosphor.

The present inventors conducted an intensive investigation in consideration of the above-mentioned background so as to successfully provide a phosphor rendering emission with a high intensity of a specific wavelength region by implementing configurations as described below. Further, a phosphor having excellent emission characteristics was successfully manufactured by employing a method described below. Further, there were successfully provided a light-emitting device, an illuminating device, an image display device, a pigment, and an ultraviolet absorber having excellent features by implementing configurations as described below.

A phosphor according to the present invention may be a phosphor (hereinafter referred to as "phosphor (1)") comprising: an inorganic compound comprising: a crystal represented by $LiBa_2AlSi_7N_{12}$, an inorganic crystal having the same crystal structure as a crystal structure of a crystal represented by $LiBa_2AlSi_7N_{12}$, or a solid solution crystal of these, which comprises at least a Li element, an A element, a D element, an E element, and an X element (here, A is one or two or more kinds of elements selected from the group consisting of Mg, Ca, Sr, Ba, Sc, Y, and La; D is one or two or more kinds of elements selected from the group consisting of Si, Ge, Sn, Ti, Zr, and Hf; E is one or two or more kinds of elements selected from the group consisting of B, Al, Ga, and In; X is one or two or more kinds of elements selected from the group consisting of O, N, and F), into which an M element is solid-solved (here, M is one or two or more kinds of elements selected from the group consisting of Mn, Ce, Pr, Nd, Sm, Eu, Tb, Dy, and Yb).

According to this phosphor (1), it may be a phosphor (hereinafter referred to as "phosphor (2)") in which the inorganic crystal having the same crystal structure as the crystal structure of the crystal represented by $LiBa_2AlSi_7N_{12}$ is a crystal represented by $(Li,A)_3(D,E)_8X_{12}$ and comprises: at least Ba as the A element, Si as the D element, Al as the E element and N as the X element, and O as the X element if necessary.

According to this phosphor (1) or (2), it may be a phosphor (hereinafter referred to as "phosphor (3)") in which the inorganic crystal having the same crystal structure as the crystal structure of the crystal represented by $LiBa_2AlSi_7N_{12}$ is a crystal of $Li(Ba,La)_2(Al,Si)_8(O,N)_{12}$, $Li(Ba,Sr)_2(Al,Si)_8(O,N)_{12}$, or $LiBa_2(Al,Si)_8(O,N)_{12}$.

According to any one of these phosphors (1) to (3), it may be a phosphor (hereinafter referred to as "phosphor (4)") in which the inorganic crystal having the same crystal structure as the crystal structure of the crystal represented by $LiBa_2AlSi_7N_{12}$ is represented by a composition formula of $LiBa_2Si_{7-x}Al_{1+x}O_xN_{12-x}$, $Li(Ba, La)_2Si_{7-x}Al_{1+x}O_xN_{12-x}$, or $Li(Ba, Sr)_2Si_{7-x}Al_{1+x}O_xN_{12-x}$ (where $0 \leq x \leq 4$).

According to any one of these phosphors (1) to (4), it may be a phosphor (hereinafter referred to as "phosphor (6)") in which the M element is Eu.

According to any one of these phosphors (1) to (5), it may be a phosphor (hereinafter referred to as "phosphor (6)") in which the inorganic crystal having the same crystal structure as the crystal structure of the crystal represented by $LiBa_2AlSi_7N_{12}$ is a crystal in an orthorhombic system.

According to any one of these phosphors (1) to (6), it may be a phosphor (hereinafter referred to as "phosphor (7)") in which the inorganic crystal having the same crystal structure as the crystal structure of the crystal represented by $LiBa_2AlSi_7N_{12}$ is a crystal in the orthorhombic system and has a symmetry in a space group Pnnm, and lattice constants a, b, and c have values in the following ranges:

a=1.40941±0.05 nm;

b=0.48924±0.05 nm; and c=0.80645±0.05 nm.

Here, "±0.05" indicates a tolerance and, with respect to 'a', for example, it can signify a range of 1.40941−0.05≤a≤1.40941+0.05 (the same will apply hereinafter).

According to any one of these phosphors (1) to (7), it may be a phosphor (hereinafter referred to as "phosphor (8)") in which the inorganic compound is represented by a composition formula of $Li_zM_dA_eD_fE_gX_h$ (here, z+d+e+f+g+h=1 in the formula; M is one or two or more kinds of elements selected from the group consisting of Mn, Ce, Pr, Nd, Sm, Eu, Tb, Dy, and Yb; A is one or two or more kinds of elements selected from the group consisting of Mg, Ca, Sr, Ba, Sc, Y, and La; D is one or two or more kinds of elements selected from the group consisting of Si, Ge, Sn, Ti, Zr, and Hf; E is one or two or more kinds of elements selected from the group consisting of B, Al, Ga, and In; and X is one or two or more kinds of elements selected from the group consisting of O, N, and F), and wherein the parameters z, d, e, f, g, and h satisfy all the following conditions:

0.035≤z≤0.05

0.00001≤d≤0.05

0.05≤e≤0.1

0.2≤f≤0.4

0.03≤g≤0.1

0.45≤h≤0.6.

According to the above phosphor (8), it may be a phosphor (hereinafter referred to as "phosphor (9)") in which values of the parameters z, d, e, f, g, and h are within a range satisfying all the following conditions of:

z+d+e=(3/23)±0.05;

f+g=(8/23)±0.05; and h=(12/23)±0.05.

Here, "±0.05" indicates a tolerance and, with respect to "z+d+e", for example, it can signify a range of (3/23)−0.05≤z+d+e≤(3/23)+0.05 (the same will apply hereinafter).

According to this phosphor (8) or (9), it may be a phosphor (hereinafter referred to as "phosphor (10)") in which values of the parameters f and g satisfy a condition of:

5/8<f/(f+g)<1.

According to any one of these phosphors (8) to (10), it may be a phosphor (hereinafter referred to as "phosphor (11)") in which the X element includes N and O, the inorganic compound is represented by a composition formula of $Li_zM_dA_eD_fE_gO_{h1}N_{h2}$ (here, z+d+e+f+g+h1+h2=1, and h1+h2=h in the formula), and the condition of 0<h1/(h1+h2)≤4/12 is satisfied.

According to any one of these phosphors (1) to (11), it may be a phosphor (hereinafter referred to as "phosphor (12)") in which the M element includes at least Eu.

According to any one of these phosphors (1) to (12), it may be a phosphor (hereinafter referred to as "phosphor (13)") in which the A element at least includes Ba, the D element includes Si, the E element includes Al and the X element includes N, and the X element includes O if necessary.

According to any one of these phosphors (1) to (13), it may be a phosphor (hereinafter referred to as "phosphor (14)") in which the inorganic compound is represented by a composition formula with parameters x and y of: $Eu_yLiBa_{2-y}Si_{7-x}Al_{1+x}N_{12-x}O_x$, $Eu_yLi(Ba, La)_{2-y}Si_{7-x}Al_{1+x}N_{12-x}O_x$, or $Eu_yLi(Ba, Sr)_{2-y}Si_{7-x}Al_{1+x}N_{12-x}O_x$, wherein 0≤x≤4, and 0.0001≤y<2.

According to any one of these phosphors (1) to (14), it may be a phosphor (hereinafter referred to as "phosphor (15)") in which the inorganic compound includes single crystal particles having a mean particle diameter of at least 0.1 μm and not exceeding 20 μm.

According to any one of these phosphors (1) to (15), it may be a phosphor (hereinafter referred to as "phosphor (16)") in which a sum of Fe, Co, and Ni impurity elements included in the inorganic compound does not exceed 500 ppm.

According to any one of these phosphors (1) to (16), it may be a phosphor (hereinafter referred to as "phosphor (17)") which further comprises an amorphous phase or another crystal phase that is different from the inorganic compound in addition to the inorganic compound, wherein a content amount of the inorganic compound is equal to or more than 20 mass %.

According to this phosphor (17), it may be a phosphor (hereinafter referred to as "phosphor (18)") in which the amorphous phase or the other crystal phase is an inorganic substance having electronic conductivity.

According to this phosphor (18), it may be a phosphor (hereinafter referred to as "phosphor (19)") in which the inorganic substance having the electrical conductivity is oxide, oxynitride, or nitride, any one of which includes one or two or more kinds of elements selected from a group consisting of Zn, Al, Ga, In, and Sn; or a mixture thereof.

According to any one of these phosphors (17) to (19), it may be a phosphor (hereinafter referred to as "phosphor (20)") in which the amorphous phase or the other crystal phase is another inorganic phosphor that is different from the inorganic compound.

According to any one of these phosphors (1) to (20), it may be a phosphor (hereinafter referred to as "phosphor (21)") which emits fluorescent having a peak in a wavelength range from 500 nm to 550 nm upon irradiation of an excitation source.

According to this phosphor (21), it may be a phosphor (hereinafter referred to as "phosphor (22)") in which the excitation source is an electron beam; an X-ray or light having a wavelength that is at least 100 nm and not exceeding 450 nm, such as a vacuum ultraviolet ray, an ultraviolet ray or visible light.

According to any one of these phosphors (1) to (22), it may be a phosphor (hereinafter referred to as "phosphor (23)") in which Eu is solid-solved into the crystal represented by $LiBa_2AlSi_7N_{12}$ or the inorganic crystal having a same crystal structure as the crystal structure of the crystal represented by $LiBa_2AlSi_7N_{12}$, wherein the phosphor emits fluorescent of green color having an emission peak in a wavelength range of at least 500 nm and not exceeding 550 nm upon irradiation of light having a wavelength from 360 nm to 450 nm.

According to any one of these phosphors (1) to (23), it may be a phosphor (hereinafter referred to as "phosphor (24)") in which a color of light emitted upon irradiation of an excitation source satisfies, in terms of values of (x0, y0) of CIE 1931 chromaticity coordinates, conditions:

0≤x0≤0.5; and 0.1≤y0≤0.9.

Here, values of CIE 1931 chromaticity coordinates are normally shown in the form of (x, y). However, in order to avoid confusion with x and y, which are used in the composition formula, x is represented by x0 and y is represented by y0 (the same will apply hereinafter).

A method of manufacturing any one of the above phosphors (1) to (24) of the present invention may be a manufacturing method (hereinafter referred to as "manufacturing method 25)") comprising: firing a raw material mixture of metal compounds, which could constitute the inorganic compound recited in claim 1 by firing the mixture, in an inert atmosphere including nitrogen in a temperature range of at least 1,200° C. and not exceeding 2,200° C.

According to the above manufacturing method (25), it may be a manufacturing method (hereinafter referred to as "manufacturing method (26)"), in which the mixture of metal compounds comprises: a compound including Li, a compound including M, a compound including A, a compound including D, a compound including E, and a compound including X (wherein M is one or two or more kinds of elements selected from a group consisting of Mn, Ce, Pr, Nd, Sm, Eu, Tb, Dy, and Yb; A is one or two or more kinds of elements selected from a group consisting of Mg, Ca, Sr, and Ba; D is one or two or more kinds of elements selected from a group consisting of Si, Ge, Sn, Ti, Zr, and Hf; E is one or two or more kinds of elements selected from a group consisting of B, Al, Ga, In, Sc, Y, and La; and X is one or two or more kinds of elements selected from a group consisting of O, N, and F).

According to the above manufacturing method (25) or (26), it may be a manufacturing method (hereinafter referred to as "manufacturing method (27)"), in which the compound including Li is a single kind of substance or a mixture of at least two kinds of substances selected from a group consisting of metal, silicide, oxide, carbonate, nitride, oxynitride, chloride, fluoride and oxyfluoride, each of which includes Li; the compound including M is a single kind of substance or a mixture of at least two kinds of substances selected from a group consisting of metal, silicide, oxide, carbonate, nitride, oxynitride, chloride, fluoride and oxyfluoride, each of which includes M; the compound including A is a single kind of substance or a mixture of at least two kinds of substances selected from a group consisting of metal, silicide, oxide, carbonate, nitride, oxynitride, chloride, fluoride, and oxyfluoride, each of which includes A; the compound including D is a single kind of substance or a mixture of at least two kinds of substances selected from a group consisting of metal, silicide, oxide, carbonate, nitride, oxynitride, chloride, fluoride, and oxyfluoride, each of which includes D; and the compound including E is a single kind of substance or a mixture of at least two kinds of substances selected from a group consisting of metal, silicide, oxide, carbonate, nitride, oxynitride, chloride, fluoride, and oxyfluoride, each of which includes E.

According to any one of these manufacturing methods (25) to (27), it may be a manufacturing method (hereinafter referred to as "manufacturing method (28)"), in which the mixture of metal compounds includes at least nitride or oxide of europium; nitride, oxide, or carbonate of lithium; nitride, oxide, or carbonate of barium; silicon oxide or silicon nitride, and aluminum oxide or aluminum nitride.

According to any one of these manufacturing methods (25) to (28), it may be a manufacturing method (hereinafter referred to as "manufacturing method (29)"), in which the inert atmosphere including nitrogen has a pressure range of at least 0.1 MPa and not exceeding 100 MPa and the inert atmosphere including nitrogen is a nitrogen gas atmosphere.

According to any one of these manufacturing methods (25) to (29), it may be a manufacturing method (hereinafter referred to as "manufacturing method (30)"), in which graphite is used in a sample container, a heat-insulating element, or a heating element of a firing furnace to be used in the firing step.

According to any one of these manufacturing methods (25) to (30), it may be a manufacturing method (hereinafter referred to as "manufacturing method (31)"), in which a form of the mixture of metal compounds is in a powder or an aggregate state, and the step of firing is performed after the mixture of metal compounds are filled in a container as being maintained with a filling rate of 40% or less in a bulk density.

According to any one of these manufacturing methods (25) to (31), it may be a manufacturing method (hereinafter referred to as "manufacturing method (32)") comprising the step of keeping the mixture of metal compounds in a container made of boron nitride before the step of firing.

According to any one of these manufacturing methods (25) to (32), it may be a manufacturing method (hereinafter referred to as "manufacturing method (33)"), in which a form of the mixture of metal compounds is in a powder or an aggregate state, and a mean particle diameter of the powder or the aggregate is not exceeding 500 μm.

According to any one of these manufacturing methods (25) to (33), it may be a manufacturing method (hereinafter referred to as "manufacturing method (34)") comprising the step of utilizing a spray dryer, sieving, or pneumatic classification.

According to any one of these manufacturing methods (25) to (34), it may be a manufacturing method (hereinafter referred to as "manufacturing method (35)") wherein the step of firing is a pressureless sintering method or a gas-pressure sintering method.

According to any one of these manufacturing methods (25) to (35), it may be a manufacturing method (hereinafter referred to as "manufacturing method (36)"), in which a mean particle diameter of phosphor powder synthesized by firing is controlled to be at least 50 nm and not exceeding 20 μm by one or more techniques selected from pulverization, classification, and acid treatment.

According to any one of these manufacturing methods (25) to (36), it may be a manufacturing method (hereinafter referred to as "manufacturing method (37)") comprising the step of heat-treating a phosphor powder after firing, a phosphor powder after pulverization treatment, or a phosphor powder after particle size adjustment at a temperature that is equal to or higher than 1,000° C. and equal to or lower than the firing temperature.

According to any one of these manufacturing methods (25) to (37), it may be a manufacturing method (hereinafter referred to as "manufacturing method (38)"), in which another inorganic compound to produce a liquid phase at a temperature equal to or less than the firing temperature is added to the mixture of metal compounds, which is then fired in the firing step.

According to any one of these manufacturing methods (25) to (38), it may be a manufacturing method (hereinafter referred to as "manufacturing method (39)"), in which the inorganic compound to produce the liquid phase at the temperature equal to or less than the firing temperature comprises: a mixture of one or more selected from fluoride, chloride, iodide, bromide, or phosphate of one or more elements selected from Li, Na, K, Mg, Ca, Sr, and Ba.

According to either of the above manufacturing method (38) or (39), it may be a manufacturing method (hereinafter referred to as "manufacturing method (40)"), in which a content amount of the inorganic compound to produce the liquid phase at the temperature equal to or less than the firing temperature is reduced by washing with a solvent after the step of firing.

The light-emitting device of the present invention may be a light-emitting device (hereinafter referred to as "light-emitting device (41)") configured to comprise: at least a light-emitting body or light-emitting source and a phosphor (hereinafter referred to as "first phosphor"), wherein the phosphor comprises at least any one of the above-mentioned phosphors (1) to (24).

According to the above light-emitting device (41), it may be a light-emitting device (hereinafter referred to as "light-emitting device (42)"), in which the light-emitting body or light-emitting source is an organic EL light-emitting body (OLED), a semiconductor laser, a laser diode (LD), or a light-emitting diode (LED), any of which emits light of a wavelength of 330 to 500 nm.

According to the above light-emitting device (41) or (42), it may be a light-emitting device (hereinafter referred to as "light-emitting device (43)"), in which the light-emitting device is a white light-emitting diode, an illuminating device including a plurality of the white light-emitting diodes, or a backlight for a liquid crystal panel.

According to any one of the above light-emitting devices (41) to (43), it may be a light-emitting device (hereinafter referred to as "light-emitting device (44)"), in which the light-emitting body or light-emitting source emits ultraviolet or visible light having a peak wavelength of 300 to 450 nm and which is characterized by emitting light among white light or light other than the white light by mixing blue-to-red light emitted by the above-recited phosphor (first phosphor) and light having a wavelength of 450 nm or more emitted by another phosphor (hereinafter referred to as "second phosphor") such that the blue-to-red light and the light having the wavelength of 450 nm or more are selectively chosen to determine which light among the white light or the light other than the white light is emitted.

According to any one of the above light-emitting devices (41) to (44), it may be a light-emitting device (hereinafter referred to as "light-emitting device (45)"), in which the phosphor further comprises a blue phosphor (hereinafter referred to as "third phosphor") being caused to emit light having a peak wavelength of 420 nm to 500 nm or less by the light-emitting body or light emitting source. This may mean that, for example, the second phosphor includes the third phosphor.

According to the above light-emitting device (45), it may be a light-emitting device (hereinafter referred to as "light-emitting device (46)"), in which the blue phosphor is selected from a group consisting of AlN: (Eu, Si) wherein both Eu and Si are present; $BaMgAl_{10}O_{17}$:Eu; $SrSi_9AL_{19}ON_{31}$:Eu; $LaSi_9Al_{19}N_{32}$:Eu; α-sialon:Ce; and JEM:Ce.

According to any one of the above light-emitting devices (41) to (46), it may be a light-emitting device (hereinafter referred to as "light-emitting device (47)"), in which the phosphor further comprises a green phosphor (hereinafter referred to as "fourth phosphor") being caused to emit light having a peak wavelength of at least 500 nm and not exceeding 550 nm by the light-emitting body.

According to the above light-emitting device (47), it may be a light-emitting device (hereinafter referred to as "light-emitting device (48)"), in which the green phosphor is selected from a group consisting of β-sialon:Eu; (Ba,Sr,Ca,Mg)$_2$SiO$_4$:Eu wherein at least one of Ba, Sr, Ca, and Mg, is present; and (Ca,Sr,Ba)Si$_2$O$_2$N$_2$:Eu wherein at least one of Ca, Sr, and Ba is present.

According to any one of the above light-emitting devices (41) to (48), it may be a light-emitting device (hereinafter referred to as "light-emitting device (49)"), in which the phosphor further comprises a yellow phosphor (hereinafter referred to as "fifth phosphor") being caused to emit light having a peak wavelength of at least 550 nm and not exceeding 600 nm by the light-emitting body or light-emitting source. This may mean that, for example, the second phosphor includes the fifth phosphor.

According to the above light-emitting device (49), it may be a light-emitting device (hereinafter referred to as "light-emitting device (50)"), in which the yellow phosphor is selected from a group consisting of YAG:Ce; α-sialon:Eu; CaAlSiN$_3$:Ce; and La$_3$Si$_6$N$_{11}$:Ce.

According to any one of the above light-emitting devices (41) to (50), it may be a light-emitting device (hereinafter referred to as "light-emitting device (51)"), in which the phosphor further comprises a red phosphor (hereinafter referred to as "sixth phosphor") being caused to emit light having a peak wavelength of at least 600 nm and not exceeding 700 nm by the light-emitting body or light-emitting source. This may mean that, for example, the second phosphor includes the sixth phosphor.

According to the above light-emitting device (51), it may be a light-emitting device (hereinafter referred to as "light-emitting device (52)"), in which the red phosphor is selected from a group consisting of CaAlSiN$_3$:Eu; (Ca,Sr)AlSiN$_3$:Eu wherein both Ca and Sr are present; Ca$_2$Si$_5$N$_8$:Eu; and Sr$_2$Si$_5$N$_8$:Eu.

According to any one of the above light-emitting devices (41) to (52), it may be a light-emitting device (hereinafter referred to as "light-emitting device (53)"), in which the light-emitting body or light-emitting source is an LED for emitting light having a wavelength of 320 to 450 nm.

An image display device according to the present invention may be an image display device, which comprises: at least an excitation source and a phosphor (hereinafter referred to as "first phosphor"), wherein the phosphor comprises at least any one of the above phosphors (1) to (24).

According to the above image display device, the image display device may comprise any one of a fluorescent display tube (VFD), a field emission display (FED), a plasma display panel (PDP), a cathode-ray tube (CRT), and a liquid crystal display (LCD).

A pigment according to the present invention may comprise the inorganic compound recited in anyone of the above-recited phosphors (1) to (24).

An ultraviolet absorber according to the present invention may comprise the inorganic compound recited in any one of the above-recited phosphors (1) to (24).

Effect of the Invention

The phosphor according to the present invention contains, as a main component, an inorganic compound comprising: a multinary nitride or a multinary oxynitride including a monovalent element, a divalent element, a trivalent element, and a tervalent element; in particular a crystal represented by $LiBa_2AlSi_7N_{12}$; an inorganic crystal having the same crystal structure as the crystal structure of the crystal represented by $LiBa_2AlSi_7N_{12}$; or a solid-solution crystal of these, into which an activating ion is solid-solved. By configuring the phosphor as mentioned above, the phosphor exhibits blue-to-red color emission of high brightness and the phosphor of a specific composition is excellent as a green phosphor. Since the brightness of the phosphor of the present invention does not decrease even when the phosphor is exposed to the excitation source for a long period of time, the phosphor of the present invention is suitably used for a light-emitting device such as a white light-emitting diode, an illuminating device, a backlight source for a liquid crystal, VFD, FED, PDP or CRT. Further, the phosphor of the present invention absorbs ultraviolet light, and thus the phosphor is suitable for a pigment and ultraviolet absorber.

EMBODIMENT FOR CARRYING OUT THE INVENTION

Hereafter, a phosphor according to the present invention is described in detail with reference to the drawings.

Since a phosphor of the present invention, as a main component, includes: an inorganic compound comprising: a crystal represented by $LiBa_2AlSi_7N_{12}$, an inorganic crystal having the same crystal structure as a crystal structure of a crystal represented by $LiBa_2AlSi_7N_{12}$, or a solid solution crystal of these, which comprises at least a Li element, an A element, a D element, an E element, and an X element (here, A is one or two or more kinds of elements selected from the group consisting of Mg, Ca, Sr, Ba, Sc, Y, and La; D is one or two or more kinds of elements selected from the group consisting of Si, Ge, Sn, Ti, Zr, and Hf; E is one or two or more kinds of elements selected from the group consisting of B, Al, Ga, and In; X is one or two or more kinds of elements selected from the group consisting of O, N, and F), into which an M element is solid-solved (here, M is one or two or more kinds of elements selected from the group consisting of Mn, Ce, Pr, Nd, Sm, Eu, Tb, Dy, and Yb), the phosphor may serve as a phosphor characterized by high brightness. Here, in the present specification, a crystal represented by $LiBa_2AlSi_7N_{12}$, an inorganic crystal having the same crystal structure as a crystal structure of a crystal represented by $LiBa_2AlSi_7N_{12}$, or a solid solution crystal of these may also be collectively referred to as "$LiBa_2AlSi_7N_{12}$ system crystal" for the sake of simplicity.

The crystal represented by $LiBa_2AlSi_7N_{12}$, which was newly synthesized and confirmed to be a new crystal through the crystal structure analysis by the present inventors, is a crystal which has not been reported prior to the present invention.

Figure 1:
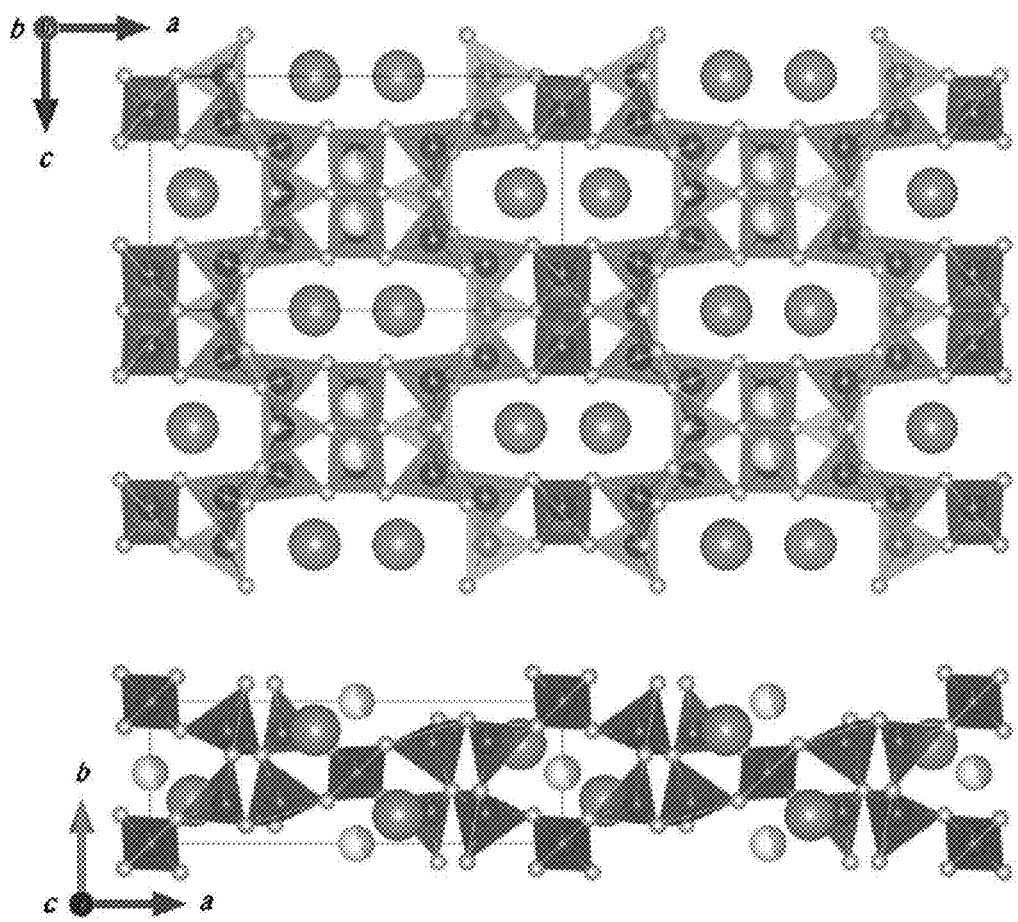
FIG. 1 is a diagram illustrating a crystal structure of $LiBa_2AlSi_7N_{12}$ crystal.

FIG. 1 is a diagram showing a crystal structure of $LiBa_2AlSi_7N_{12}$ crystal.

A crystal structure of the $LiBa_2AlSi_7N_{12}$ crystal synthesized by the present inventors is one of the crystal structures of single crystals represented by $LiBa_2AlSi_7N_{12}$, and, according to the single crystal structure analysis performed with respect to the $LiBa_2AlSi_7N_{12}$, the $LiBa_2AlSi_7N_{12}$ crystal belongs to the orthorhombic crystal system and the Pnnm space group (space group No. 58 in the International Tables for Crystallography) and has crystal parameters and atomic coordinate positions as shown in Table 1 such that each constituent element has each occupancy rate at each site.

In Table 1, lattice constants a, b, and c signify respective lengths of the axes of the unit cell, and α, β, and γ signify respective angles between axes of the unit cell. The atomic coordinates indicate a position of each atom in the unit cell in terms of a value between 0 and 1 using the unit cell as a unit. According to the analysis results thus obtained, there were atoms of Li, Ba, Si, Al, and N in this crystal, respectively, and Li existed in one kind of site: Li(1) and Ba existed in one kind of site: Ba(1). Also, analysis results that Si and Al occupied three (3) kinds of sites of (Si, Al(1)) to (Si, Al(3)) without any distinction in the kind were obtained. Further, analysis results that N occupied four (4) kinds of sites of N(1) to N(4) were obtained.

TABLE 1

| Crystal structure data of $LiBa_2AlSi_7N_{12}$ crystal | | | | |
|---|---|---|---|---|
| Crystal composition | | $LiBa_2AlSi_7N_{12}$ | | |
| Formula weight (Z) | | 2 | | |
| Crystal system | | Orthorhombic | | |
| Space group | | Pnnm | | |
| Space group number | | 58 | | |
| Lattice constants | a | 14.0941 Å | | |
| | b | 4.8924 Å | | |
| | c | 8.0645 Å | | |
| | α | 90 degree | | |
| | β | 90 degree | | |
| | γ | 90 degree | | |
| | Atomic coordinate | | | Site occupancy |
| Atom | x | y | z | rate |
| Ba(1) | 0.1021 | 0.3004 | 0.5 | 1 |
| Si, Al(1) | 0.1817 | 0.2776 | 1 | 1 |
| Si, Al(2) | 0.3141 | 0.2906 | 0.6989 | 1 |
| Si, Al(3) | 0 | 0 | 0.8416 | 1 |
| Li(1) | 0 | 0.5 | 1.108 | 0.5 |
| N(1) | 0.0635 | 0.176 | 1 | 1 |
| N(2) | 0.1989 | 0.6283 | 1 | 1 |
| N(3) | 0.0721 | −0.2008 | 0.7223 | 1 |
| N(4) | 0.2314 | 0.1267 | 1.1737 | 1 |

As a result of analysis using data in Table 1, the $LiBa_2AlSi_7N_{12}$ crystal was found to have the structure as shown in FIG. 1, in which a Li element and a Ba element are included in a skeleton formed by linking tetrahedrons constituted of bonds of Si or Al with N.

As a crystal having a crystal structure identical to the crystal structure of $LiBa_2AlSi_7N_{12}$ crystal, which was synthesized and subjected to the structure analysis, there may be included $(Li, A)_3(D, E)_8X_{12}$ crystal and $(Li, A)_3(D, E)_8(O, N)_{12}$ crystal. The A element may be typically Ba, a mixture of Sr and Ba, or a mixture of Sr and La.

In the $(Li, A)_3(D, E)_8X_{12}$ crystal, A can occupy sites which Ba is supposed to occupy, D and E can occupy sites which Si and Al are supposed to occupy without any distinction with each other, and X can occupy sites which N is supposed to occupy in the $LiBa_2AlSi_7N_{12}$ crystal. Thus, a relative ratio of numbers of atoms can be adjusted to 3 for the sum of Li and the A element, 8 for the sum of the D element and the E element, and 12 for the sum of the X element, while the crystal structure remains the same. However, it is desirable to have a ratio of cation such as Li, A, D, and E to anion such as X satisfying an electrical neutrality condition in the crystal.

In $(Li, A)_3(Si, Al)_8(O,N)_{12}$ crystal, Si and Al can occupy sites which Si and Al are supposed to occupy without any distinction with each other, and O and N can occupy sites which N is supposed to occupy in the identical crystal structure of $LiBa_2AlSi_7N_{12}$ crystal. Thus, a relative ratio of numbers of atoms can be adjusted to 3 for the sum of Li and the A element, 8 for the sum of Si and Al, and 12 for the sum of O and N, while the crystal structure remains the same. However, it is desirable to have a ratio of Si/Al and a ratio of O/N so as to satisfy a condition of the electrical neutrality in the crystal.

The $LiBa_2AlSi_7N_{12}$ system crystal of the present invention can be identified by means of the X-ray diffraction or the neutron diffraction. As a substance exhibiting the identical diffraction to that of the $LiBa_2AlSi_7N_{12}$ crystal shown with respect to the present invention as a result of the X-ray diffraction, there is, for example, a crystal represented by $(Li, A)_3(D, E)_8X_{12}$. Further, there may be a crystal in which lattice constants or atomic positions are changed by substituting other elements for constituent elements in the crystal structure identical to that of the $LiBa_2AlSi_7N_{12}$ crystal. Here, the material in which the constituent elements are substituted with the other elements may include, for example, a material in which Li in the $LiBa_2AlSi_7N_{12}$ crystal is partially substituted with a monovalent element such as Na. Further, a material in which Ba in the $LiBa_2AlSi_7N_{12}$ crystal is partially or completely substituted with the A element other than Ba (Here, A is one or two or more kinds of elements selected from Mg, Ca, Sr, Ba, Sc, Y, and La) or the M element (Here, M is one or two or more kinds of elements selected from Mn, Ce, Pr, Nd, Sm, Eu, Tb, Dy, and Yb) may be included. Further, a material in which Si in the crystal is partially or completely substituted with the D element other than Si (Here, D is one or two or more kinds of elements selected from Si, Ge, Sn, Ti, Zr, and Hf) may be included. Further, a material in which Al in the crystal is partially or completely substituted with the E element other than Al (here, E is one or two or more kinds of elements selected from B, Al, Ga, and In) may be included. Further, a material in which N in the crystal is partially or completely substituted with fluorine may be included. It is desirable that these substitutions are performed such that neutrality of charges in the whole crystal is maintained. The material in which a crystal structure thereof remains unchanged as a result of these element substitutions may be referred to as "$LiBa_2AlSi_7N_{12}$ system crystal". Since emission characteristics, chemical stability, and thermal stability of the phosphor are changed by the substitution of elements, the substitution of elements can be selectively utilized at an appropriate time for each application thereof as far as the crystal structure remains the same.

In the $LiBa_2AlSi_7N_{12}$ system crystal, the lattice constants change as the constituent components are substituted with other elements or as an activating element such as Eu is solid-solved therein, but the crystal structure, and the atomic positions given by sites to be occupied by atoms and coordinates thereof do not significantly change to an extent in which a chemical bond between skeleton atoms is broken. In the present invention, a crystal structure is defined to be identical to that of the $LiBa_2AlSi_7N_{12}$ crystal if lengths of chemical bonds (distance of neighboring atoms) of Al—N and Si—N calculated from the lattice constants and atomic coordinates obtained by conducting Rietveld analysis of the results from the X-ray diffraction or the neutron diffraction in the space group of Pnnm are compared with lengths of chemical bonds calculated from the lattice constants and atomic coordinates of the $LiBa_2AlSi_7N_{12}$ crystal as shown in Table 1 such that the difference between the lengths is within ±5%, and using the definition it is determined whether the crystal having the crystal structure belongs to the $LiBa_2AlSi_7N_{12}$ system crystal or not. This determination criterion is employed herein since it was once observed that a crystal in the $LiBa_2AlSi_7N_{12}$ system crystal was changed to become another crystal due to breakage of chemical bonds when lengths of the chemical bonds were changed beyond ±5% according to the prior experiments.

Further, in case an amount of solid-solution is small, a simple method for determining whether it belongs to the $LiBa_2AlSi_7N_{12}$ system crystal or not is described as follows. A new substance can be identified to have the same crystal structure if main peaks of the resultant X-ray diffraction pattern measured with the new substance are respectively located at diffraction peak positions, which agree with the peak positions (2θ) of the diffraction pattern calculated using the crystal structure data of Table 1 and the lattice constants calculated from the resultant X-ray diffraction pattern.

Figure 2:
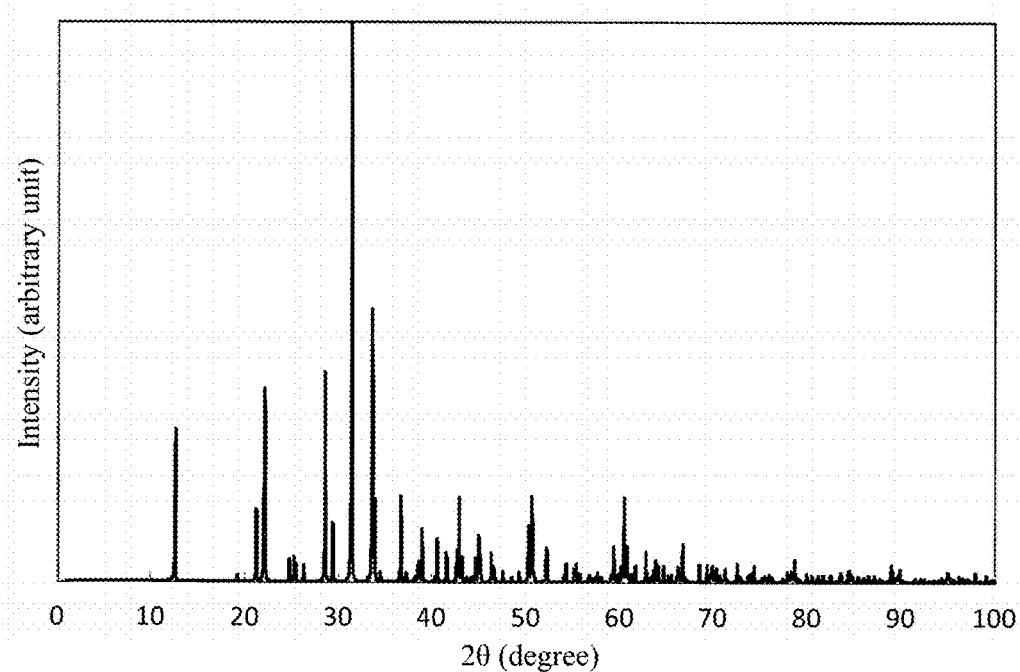
FIG. 2 is a diagram showing a powder X-ray diffraction pattern using Cu Kα-line, calculated from a crystal structure of $LiBa_2AlSi_7N_{12}$ crystal.

FIG. 2 is a diagram showing a powder X-ray diffraction pattern using Cu Kα-line calculated from the crystal structure of the $LiBa_2AlSi_7N_{12}$ crystal.

Since a synthesized compound through an actual synthesis is obtained in a powder state, the powder X-ray diffraction pattern of the thus-obtained synthesized compound are compared to the powder X-ray diffraction pattern of FIG. 2 such that it can be determined in a simplified manner whether the synthesized compound belongs to the $LiBa_2AlSi_7N_{12}$ system crystal or not.

The identification may be conducted with approximately ten (10) peaks (depending on conditions, the number of peaks may include 3, 4, 5, 6, 7, 8, 9, 10, 11, 12, or more) which have high intensity of diffraction as the main peaks of the powder X-ray diffraction pattern of the $LiBa_2AlSi_7N_{12}$ system crystal. Table 1 is important in this sense since it could be referenced when the identification of the $LiBa_2AlSi_7N_{12}$ system crystal is conducted. Further, it is also possible to define a crystal structure of the $LiBa_2AlSi_7N_{12}$ system crystal as an approximate structure using another crystal system of the orthorhombic crystal and, in such a case, the crystal structure is expressed using a different space group, different lattice constants, and different plane indices, but the X-ray diffraction pattern (for example, FIG. 2) and the crystal structure (for example, FIG. 1) remain unchanged. Therefore, even if an identification method using the other crystal system is employed, an identification result thereof should be inherently the same. Therefore, in the present invention, it is to perform an X-ray diffraction analysis using the orthorhombic crystal system. The method of identifying the substance based on Table 1 will be concretely described in Examples to be described later, and the explanation of the method described herein is just in general.

A phosphor can be obtained if the $LiBa_2AlSi_7N_{12}$ system crystal is activated by the M element, one or two or more kinds of which are selected from Mn, Ce, Pr, Nd, Sm, Eu, Tb, Dy, Ho, Er, Tm, and Yb. Since emission characteristics such as an excitation wavelength, an emission wavelength, and emission intensity may vary depending on the composition of the $LiBa_2AlSi_7N_{12}$ system crystal, and the kind and quantity of the activating element, such conditions may be chosen in accordance with an application thereof.

If an inorganic crystal having a crystal structure identical to that of the crystal represented by $LiBa_2AlSi_7N_{12}$ is a crystal represented by $(Li, A)_3(D, E)_8X_{12}$ and has a composition in which, at least, the A element includes Ba, the D element includes Si, the E element includes Al, the X element includes N, and the X element includes O if necessary, then the inorganic crystal exhibits high emission intensity.

Further, a phosphor including an inorganic compound comprising a crystal in which the A element is Ba or a combination of Ba and La, the D element is Si, the E element is Al, and the X element is N or a combination of N and O, wherein Eu is solid-solved as the M element into the crystal, emits green light having a peak at a wavelength in a range of at least 500 nm and not exceeding 550 nm. Also, the phosphor of the present invention emits green light having a peak at a wavelength in a range of at least 500 nm and not exceeding 520 nm by adjusting the composition.

Further, a phosphor including an inorganic compound comprising a crystal in which the A element is a combination of Ba and Sr, the D element is Si, the E element is Al, and the X element is N or a combination of N and O, wherein Eu is solid-solved as the M element into the crystal, emits red light having a peak at a wavelength in a range of at least 620 nm and not exceeding 670 nm.

A phosphor comprising an inorganic crystal which has a crystal structure identical to that of the crystal represented by $LiBa_2AlSi_7N_{12}$, and is $Li(Ba, La)_2(Al, Si)_8(O, N)_{12}$, $Li(Ba, Sr)_2(Al, Si)_8(O, N)_{12}$, or $LiBa_2(Al, Si)_8(O, N)_{12}$, is characterized in that the crystal is stable and the emission intensity is high.

The phosphor in which an inorganic crystal thereof having a crystal structure identical to that of the crystal represented by $LiBa_2AlSi_7N_{12}$ comprises, as a host crystal (mother crystal), a crystal represented by a composition formula: $LiBa_2Si_{7-x}Al_{1+x}O_xN_{12-x}$, $Li(Sr, Ba)_2Si_{7-x}Al_{1+x}O_xN_{12-x}$, or $Li(Sr, La)_2Si_{7-x}Al_{1+x}O_xN_{12-x}$ (here, $0 \leq x \leq 4$), is a phosphor which exhibits high emission intensity and can be controlled in the color change of the emission by changing a composition thereof. The range of x is preferably: $0 \leq x \leq 2$ since the crystal may be stable.

A phosphor having Eu as the activating M element exhibits in particular high emission intensity.

Inorganic crystals having a crystal structure identical to that of the crystal represented by $LiBa_2AlSi_7N_{12}$ are crystals which belong to the orthorhombic crystal system such that the crystals are in particular stable and phosphors including these crystals as the host crystal exhibit high emission intensity.

Further, if an inorganic crystal having a crystal structure identical to that of the crystal represented by $LiBa_2AlSi_7N_{12}$ is a crystal that belongs to the orthorhombic crystal system and has the symmetry of space group Pnnm, and in which lattice constants thereof a, b, and c are in the following range:

$a = 1.40941 \pm 0.05$ nm;
$b = 0.48924 \pm 0.05$ nm; and
$c = 0.80645 \pm 0.05$ nm, the crystal is particularly stable such that a phosphor having such inorganic crystal as a host crystal exhibits high emission intensity. If a crystal is prepared out of the above range, the crystal may become unstable and the emission intensity may occasionally decrease.

A phosphor in which an inorganic compound thereof is represented by a composition formula $Li_zM_dA_eD_fE_gX_h$ (here, in the formula, $z+d+e+f+g+h=1$, M is one or two or more kinds of elements selected from Mn, Ce, Pr, Nd, Sm, Eu, Tb, Dy, and Yb; A is one or two or more kinds of elements selected from Mg, Ca, Sr, Ba, Sc, Y, and La; D is one or two or more kinds of elements selected from Si, Ge, Sn, Ti, Zr, and Hf; E is one or two or more kinds of elements selected from B, Al, Ga, and In; X is one or two or more kinds of elements selected from O, N, and F), and parameters z, d, e, f, g, and h satisfy all conditions:

$0.035 \leq z \leq 0.05$;

$0.00001 \leq d \leq 0.05$;

$0.05 \leq e \leq 0.1$;

$0.2 \leq f \leq 0.4$;

$0.03 \leq g \leq 0.1$; and $0.45 \leq h \leq 0.6$, exhibits particularly high emission intensity.

The parameter z represents a constituent amount of the Li element and if it is less than 0.035 or more than 0.05, the crystal structure may become unstable such that the emission intensity may be lowered. The parameter d represents an additive amount of the activating element and if the additive amount is less than 0.00001, the amount of the activating ion becomes insufficient such that the emission intensity may be decreased. If the amount is more than 0.05, the emission intensity may be decreased due to the concentration quenching by a mutual interaction between activating ions. The parameter e is a parameter representing a constituent amount of the alkaline earth element such as Ba and, if the amount is less than 0.05 or more than 0.1, the crystal structure becomes unstable so as to cause the emission intensity to decrease. The parameter f is a parameter representing a constituent amount of the D element such as Si and, if the amount is less than 0.5 or more than 0.4, the crystal structure becomes unstable so as to cause the emission intensity to decrease. The parameter g is a parameter representing a constituent amount of the E element such as Al and, if the amount is less than 0.03 or more than 0.1, the crystal structure becomes unstable so as to cause the emission intensity to decrease. The parameter h is a parameter representing a constituent amount of the X element such as O, N, and F, and, if the amount is less than 0.45 or more than 0.6, the crystal structure becomes unstable so as to cause the emission intensity to decrease. The X element is an anion, and composition ratios of O, N, and F are determined in order to maintain the charge neutrality with cations of the A, M, D and E elements.

Further, an inorganic compound having parameters z, d, e, f, g, and h satisfy all of the following conditions:

$$z+d+e=(3/23)\pm0.05;$$

$$f+g=(8/23)\pm0.05; \text{ and}$$

$$h=(12/23)\pm0.05,$$

is stable in the crystal structure such that the emission intensity is particularly high. The inorganic compound satisfying all the following conditions:

$$z+d+e=3/23;$$

$$f+g=8/23; \text{ and}$$

$$h=12/23,$$

that is, the crystal having a composition of $(Li, A)_3(D, E)_8X_{12}$ is in particular stable in the crystal structure such that the emission intensity is particularly high.

Further, the inorganic compound having the parameters f and g satisfy the condition:

$$5/8 < f/(f+g) < 1,$$

is stable in the crystal structure such that the emission intensity is high.

In the above composition formula, the inorganic compound in which the X element includes N and O and which is represented by a composition formula: $Li_zM_dA_eD_fE_gO_{h1}N_{h2}$ (here, $z+d+e+f+g+h1+h2=1$ and $h1+h2=h$ in the formula) and satisfies the condition:

$$0<O/(O+N)\leq 4/12,$$

is stable in the crystal structure such that the emission intensity is high.

In the above composition formula, the phosphor in which the M element as the activating element includes at least Eu is a phosphor to exhibit particularly high emission intensity among those of the present invention and it is possible to obtain a phosphor having a specific composition which may emit green light having a peak at a wavelength in a range of at least 500 nm and not exceeding 550 nm, or red light having a peak at a wavelength in a range of at least 620 nm and not exceeding 670 nm.

In the above composition formula, the inorganic compound in which, at least, the A element includes Ba, the D element includes Si, the E element includes Al, the X element includes N, and the X element includes O if necessary, is stable in the crystal structure such that the emission intensity is high.

A phosphor including an inorganic compound which is represented, using parameters x and y, by: $Eu_yLiBa_{2-y}Si_{7-x}Al_{1+x}N_{12-x}O_x$, $Eu_yLi(Ba, La)_{2-y}Si_{7-x}Al_{1+x}N_{12-x}O_x$, or $Eu_yLi(Ba, Sr)_{2-y}Si_{7-x}Al_{1+x}N_{12-x}O_x$, where $$0 \leq x \leq 4 \text{ and}$$

$$0.0001 \leq y < 2,$$

can keep a stable crystal structure thereof even though a ratio of Eu to Ba, a ratio of Si to Al, and a ratio of N to O are changed in the respective composition ranges by changing the parameters x and y. Thus, it is a phosphor that is easy to make a material design since an excitation wavelength thereof or an emission wavelength thereof can be continuously changed by utilizing this feature. The range of x is preferably given by $0 \leq x < 2$, since the crystal may become stable.

A phosphor including an inorganic compound which comprises single crystal particles or an aggregate of the single crystals having a mean particle diameter of 0.1 μm or more and 20 μm or less has high emission efficiency and a good handling property when it is implemented into an LED such that it is good to control the particle diameter thereof in this range.

Impurity elements of Fe, Co, and Ni included in the inorganic compound may cause the emission intensity to decrease. If the sum of these impurity elements in the phosphor is controlled to be 500 ppm or less, an influence of these elements on the emission intensity is decreased.

As one of the embodiments of the present invention, a phosphor of the present invention comprises a mixture of an inorganic compound including, as the host crystal, the above $LiBa_2AlSi_7N_{12}$ system crystal into which the activating ion M is solid-solved and an amorphous phase or another crystal phase other than this crystal wherein a content amount of the inorganic compound of the phosphor is 20 mass % or more. In the case where a single body of the phosphor of the $LiBa_2AlSi_7N_{12}$ system crystal cannot achieve a target property or a feature such as electrical conductivity is added thereto, the present embodiment may be adapted. The content amount of the $LiBa_2AlSi_7N_{12}$ system crystal may be adjusted in accordance with the target properties, but the emission intensity of the phosphor may be lowered if the content amount is 20 mass % or less. From this perspective, it is preferable to have 20 mass % or more of the main component of the above-mentioned inorganic compound in the phosphor of the present invention.

In the case where the phosphor is supposed to need electrical conductivity in an application in which electron beam excitation or the like is employed, an inorganic substance having electrical conductivity may be added thereto as another crystal phase or an amorphous phase.

The inorganic substance having the electrical conductivity comprises: oxide, oxynitride, nitride, or a mixture of these, which includes one or two or more kinds of elements selected from Zn, Al, Ga, In, and Sn. In concrete, the inorganic substance may comprise zinc oxide, aluminum nitride, indium nitride, tin oxide, and so on.

In the case where a target emission spectrum cannot be achieved with a single phosphor of the $LiBa_2AlSi_7N_{12}$ system crystal, a second phosphor other than the phosphor of the $SrSi_3Al_2O_4N_4$ system crystal may be added. The other phosphors include a BAM phosphor, a β-sialon phosphor, an α-sialon phosphor, a $(Sr, Ba)_2Si_5N_8$ phosphor wherein at least one of Sr and Ba is present, a $CaAlSiN_3$ phosphor, a $(Ca, Sr)AlSiN_3$ phosphor wherein both Ca and Sr are present, and so on. Here, as the other crystal phase or an amorphous phase, an inorganic phosphor other than the inorganic compound of the present invention as described above may be used.

As one of the embodiments of the present invention, there is a phosphor having a peak at a wavelength in the range of at least 620 nm and not exceeding 670 nm by irradiation of an excitation source. For example, a phosphor of the $LiBa_2AlSi_7N_{12}$ system crystal in which Eu is activated has an emission peak in this range by adjusting the composition. By way of example, in the $LiBa_2AlSi_7N_{12}$ system crystal in which Eu is activated, a phosphor in which the A element is Ba or a combination of Ba and La emits green light having a peak at a wavelength in the range of at least 500 nm and not exceeding 550 nm while, in the $LiBa_2AlSi_7N_{12}$ system crystal in which Eu is activated, a phosphor in which the A element is a combination of Ba and Sr emits red light having a peak at a wavelength in the range of at least 620 nm and not exceeding 670 nm.

As one of the embodiments of the present invention, there is a phosphor emitting light with an excitation source of an electron beam; an X-ray or light having a wavelength of at least 100 nm and not exceeding 450 nm, such as a vacuum ultraviolet ray, ultraviolet ray or visible light. The phosphor can be made to emit light efficiently by using such excitation sources.

As one of the embodiments of the present invention, there are phosphors comprising an inorganic compound including a crystal represented by $LiBa_2AlSi_7N_{12}$ and an inorganic crystal having the identical crystal structure to that of the crystal represented by $LiBa_2AlSi_7N_{12}$, wherein Eu is solid-solved in the inorganic compound. By adjusting the composition, upon irradiation of light from 360 nm to 450 nm, green fluorescence having a peak at a wavelength in the range of at least 500 nm and not exceeding 550 nm or red fluorescence having a peak at a wavelength in the range of at least 620 nm and not exceeding 670 nm is emitted such that a suitable use may be for a white LED or the like utilizing green light emission or red light emission.

By way of example, a phosphor comprising: $LiBa_2AlSi_7N_{12}$ crystal, a crystal represented by $LiBa_2(Al, Si)_8(O, N)_{12}$, or a crystal represented by $Li(Ba, La)_2(Al, Si)_8N_{12}$ in which Eu is solid-solved emits green fluorescence of high brightness in the range of at least 500 nm and not exceeding 550 nm upon irradiation of light from 360 nm to 450 nm. A phosphor in which Eu is solid-solved in the crystal represented by $Li(Ba, Sr)_2(Al, Si)_8N_{12}$ emits red fluorescence of high brightness in the range of at least 620 nm and not exceeding 670 nm upon irradiation of light in the range from 360 nm to 450 nm.

As one of the embodiments of the present invention, there is a phosphor in which a color of light emitted upon irradiation of an excitation source satisfies, in terms of values of (x0, y0) of CIE 1931 chromaticity coordinates, conditions:

$0 \leq x0 \leq 0.5$ and $0.1 \leq y0 \leq 0.9$.

For example, it is possible to obtain a phosphor emitting light of the color in the above range on the chromaticity coordinates by adjusting the composition given by $Eu_yLiBa_{2-y}Si_{7-x}Al_{1+x}N_{12-x}O_x$, where $0 \leq x < 4$, and $0.0001 \leq y \leq 2$.

The obtained phosphor may be utilized in an application of green color emission of a white LED or the like.

Thus, the phosphor of the present invention is characterized by having a wide excitation range of an electron beam and X-ray and light from ultraviolet light to visible light, emitting light of blue-to-green-to-red color, in particular, exhibiting green color from 500 nm to 550 nm or red color from 620 nm to 670 nm with a specific composition thereof, and being capable of adjusting an emission wavelength and an emission peak width. Thus, the phosphor of the present invention is suitable for an illuminating device, an image display device, pigment, and an ultraviolet absorber because of such emission characteristics. The phosphor of the present invention has advantages of excellent heat resistance since it does not degrade even if it is exposed to high temperature, and excellent long-term stability under an oxidizing atmosphere and a moisture environment, and thus a product having excellent durability can be provided by utilizing the phosphor.

A method of manufacturing such a phosphor of the present invention is not particularly limited thereto, but, for example, such a phosphor can be obtained by firing a mixture of metal compounds that can constitute an inorganic compound having the $LiBa_2AlSi_7N_{12}$ system crystal as the host crystal, into which the activating ion M is solid-solved through firing, in a nitrogen-containing inert atmosphere in the temperature range of 1,200° C. or higher and 2,000° C. or lower. While the main crystal of the present invention belongs to the orthorhombic system and the space group Pnnm, another crystal that belongs to another crystal system or another space group other than the above may be occasionally mixed therein depending on synthesis conditions such as firing temperature. However, even in such a case, a change of the emission characteristics is slight and therefore the thus-obtained product can be used as a phosphor of high brightness.

As a starting raw material, by way of example, a mixture of metal compounds may comprise: a compound including Li, a compound including M, a compound including A, a compound including D, a compound including E, and a compound including X, (wherein M is one or two or more kinds of elements selected from a group consisting of Mn, Ce, Pr, Nd, Sm, Eu, Tb, Dy, and Yb; A is one or two or more kinds of elements selected from a group consisting of Mg, Ca, Sr, and Ba; D is one or two or more kinds of elements selected from a group consisting of Si, Ge, Sn, Ti, Zr, and Hf; E is one or two or more kinds of elements selected from a group consisting of B, Al, Ga, In, Sc, Y, and La; and X is one or two or more kinds of elements selected from a group consisting of O, N, and F).

As the starting material, the mixture, which comprises the compound including Li that is a single substance or a mixture of at least two kinds of substances selected from metal, silicide, oxide, carbonate, nitride, oxynitride, chloride, fluoride, or oxyfluoride including Li; the compound including M that is a single substance or a mixture of at least two kinds of substances selected from metal, silicide, oxide, carbonate, nitride, oxynitride, chloride, fluoride, or oxyfluoride including M; the compound including A that is a single substance or a mixture of at least two kinds of substances selected from metal, silicide, oxide, carbonate, nitride, oxynitride, chloride, fluoride, or oxyfluoride including A; the compound including D that is a single substance or a mixture of at least two kinds of substances selected from a metal, silicide, oxide, carbonate, nitride, oxynitride, chloride, fluoride or oxyfluoride including D; and the compound including E that is a single substance or a mixture of at least two kinds of substances selected from a metal, silicide, oxide, carbonate, nitride, oxynitride, chloride, fluoride or oxyfluoride including E, is preferable because these raw materials are easily available and have excellent stability. The mixture, which comprises the compound including X that is a single substance or a mixture of at least two kinds of substances selected from oxide, nitride, oxynitride, fluoride, and oxyfluoride, is preferable because each raw material is easily available and has excellent stability.

In the case where a phosphor of the $LiBa_2AlSi_7N_{12}$ system crystal activated by Eu is manufactured, it is preferable to use a starting material comprising, at least, nitride or oxide of europium; nitride, oxide, or carbonate of lithium; nitride, oxide, or carbonate of barium; silicon oxide or silicon nitride; and aluminum oxide or aluminum nitride, since the reaction tends to easily proceed during the firing.

Since the firing temperature is high and the firing atmosphere is an inert atmosphere containing nitrogen, an electric furnace of a metal resistance heating type or a graphite resistance heating type, in which a high temperature member of the furnace made of carbon is used, is suitable as a furnace for firing.

The pressure range of the nitrogen-containing inert atmosphere is preferably in the range of at least 0.1 MPa and not exceeding 100 MPa because thermal decomposition of nitride or oxynitride of the starting material or the product is suppressed. The nitrogen-containing inert atmosphere is preferably a nitrogen gas atmosphere. It is preferable that the oxygen partial pressure is 0.0001% or less in the firing atmosphere in order to suppress the oxidation reaction of nitride or oxynitride of the starting material or the product.

Here, the firing time is, depending on the firing temperature, usually 1 to 10 hours or so.

In order to manufacture the phosphor in the form of powder or aggregate, it is preferable to utilize a method of firing a mixture of metal compounds in a powder form or an aggregate form after the mixture is filled in a container with a filling rate kept at the bulk density of 40% or lower. It is possible to prevent particles from adhering with each other by maintaining the bulk density of 40% or lower in the filling rate. Here, the term relative bulk density means the ratio of a value (bulk density) given by dividing the mass of powder material filled in the container by the capacity of the container to the real density of the substance of the powder material. Unless otherwise noted, the relative bulk density is referred to as simply the bulk density.

Various kinds of heat-resistant materials can be used for the container containing the mixture in firing the mixture of metal compounds. However, in view of a low adverse effect of material deterioration on the metal nitride used in the present invention, a container made of boron nitride material such as sintered boron nitride body or a boron nitride coated container, which is exemplified by a boron nitride coated graphite crucible used for synthesis of an α-sialon as described in a scientific journal of "Journal of the American Ceramic Society" Vol. 85, No. 5, pages 1229 to 1234 in 2002. When the firing is performed under such conditions, boron or boron nitride component is mixed into the product from the container, but, if the amount thereof is small, an effect of mixing is slight since the emission characteristics are not decreased. Further, durability of the product may be occasionally improved by the addition of a small amount of boron nitride thereto, and such addition may be preferable in some cases.

In order to manufacture the phosphor in the form of powder or aggregate, the mixture of metal compounds is in a powder form or an aggregate form and it is preferable to make the mean particle diameter of these equal to or less than 500 μm since the mixture has excellent reactivity and handling characteristics.

As a method of adjusting a particle size of the particles or aggregates to be 500 μm or less, it is preferable to employ a spray dryer, sieving, or pneumatic classification since such a method has excellent operating efficiency and handling characteristics.

In order to manufacture a phosphor in a powder form or an aggregate form, it is preferable to employ a method of firing in which no external mechanical pressing is applied such as a pressureless sintering method and a gas pressure sintering method, but not a hot-pressing method.

A mean particle diameter of phosphor powder is preferably 50 nm or more to 200 μm or less in terms of a volume-based median diameter (d50) because the emission intensity is high. The volume-based mean particle diameter can be measured, for example, according to a Microtrac or a laser light scattering method. A mean particle diameter of phosphor powder synthesized by firing may be satisfactorily adjusted to be 50 nm or more to 200 μm or less by applying at least one technique selected from pulverization, classification and acid treatment.

A defect included in powder and a damage caused by pulverization may be occasionally cured by heat-treating of phosphor powder after firing, phosphor powder after pulverizing treatment, or phosphor powder after adjusting a particle size at a temperature of at least 1,000° C. and not exceeding the firing temperature. The defect or damage may occasionally cause a decrease in the emission intensity, but the emission intensity recovers by the heat treatment.

In the case of firing for synthesis of the phosphor, an inorganic compound to produce a liquid phase at a temperature of a firing temperature or lower may be added and the firing is conducted. The inorganic compound to produce the liquid phase may serve as a flux to promote the reaction and particle growth such that a stable crystal may be obtained and that the emission intensity may be occasionally improved.

The inorganic compound to produce the liquid phase at the temperature of the firing temperature or lower may include a single kind of or a mixture of two or more kinds of fluoride, chloride, iodide, bromide, or phosphate of one or two or more kinds of elements selected from Li, Na, K, Mg, Ca, Sr, and Ba. These inorganic compounds have different melting points, respectively, and therefore may be satisfactorily used properly depending on a synthesizing temperature.

Further, the content amount of the inorganic compound producing the liquid phase at the temperature of the firing temperature or lower is decreased by washing the phosphor with a solvent after the firing. Thus, the emission intensity of the phosphor may occasionally become high.

When the phosphor of the present invention is used in an application of a light-emitting device or the like, it is preferable to use the phosphor dispersed in a liquid medium. Further, the phosphor can also be used in the form of a phosphor mixture containing the phosphor of the present invention. A composition prepared by dispersing the phosphor of the present invention in the liquid medium is referred to as a phosphor-containing composition.

As the liquid medium that can be used for the phosphor-containing composition of the present invention, any liquid medium can be selected depending on a purpose or the like, if the liquid medium shows liquid properties under desired use conditions to suitably disperse the phosphor of the present invention, and simultaneously does not cause an undesirable reaction or the like. Specific examples of the liquid medium include an addition reaction type silicone resin and a condensation reaction type silicone resin before curing, a modified silicone resin, an epoxy resin, a polyvinyl resin, a polyethylene resin, a polypropylene resin and a polyester resin. With respect to the liquid media, a single kind of liquid medium may be used by itself, or any combination of two or more kinds of liquid media with any combination ratio thereof may be used.

An amount of used liquid medium or media may be appropriately adjusted depending on an application or the like. In general, the amount is in the range of generally 3 wt % or more and preferably 5 wt % or more, to generally 30 wt % or less and preferably 15 wt % or less in terms of the weight ratio of the liquid medium to the phosphor of the present invention.

Further, the phosphor-containing composition of the present invention may contain, in addition to the phosphor and the liquid medium, any other component depending on an application or the like. Specific examples of the other component include a dispersing agent, a thickening agent, an extending agent and a buffering agent. Specifically, the examples include silica fine powder such as Aerosil, alumina, and so on.

The light-emitting device of the present invention comprises at least a light-emitting body or an emission source, and the phosphor wherein the phosphor includes at least the above-described the phosphor of the present invention.

As the light-emitting body or the emission source, there are an LED light-emitting instrument, a laser diode (LD) light-emitting instrument, a semiconductor laser, an organic EL light-emitting body (OLED), a fluorescent lamp, and so on. The LED light-emitting device can be manufactured using the phosphor of the present invention and a publicly known method which is described in Japanese Patent Application Publication No. H05-152609, Japanese Patent Application Publication No. H07-99345, Japanese Patent No. 2927279, and the like. In this case, the light-emitting body or the emission source is preferably what emits light of a wavelength region of from 330 to 500 nm. In particular, an LED light-emitting element emitting an ultraviolet (or violet) ray of a wavelength region of 330 to 420 nm, or an LED light-emitting element emitting blue light in a wavelength region of 420 to 450 nm is preferable. Such LED light-emitting elements include a nitride semiconductor such as GaN or InGaN, which can be an emission source of a predetermined wavelength by adjusting the composition.

As a light-emitting device of the present invention, there are a white light-emitting diode, an illuminating device including a plurality of white light-emitting diodes, a backlight for a liquid crystal panel, and the like, which include the phosphor of the present invention, respectively.

In such light-emitting devices, in addition to the phosphor of the present invention, the device may further include one or two or more kinds of phosphors selected from β-sialon green phosphor activated with Eu, α-sialon yellow phosphor activated with Eu, $Sr_2Si_5N_8$ orange phosphor activated with Eu, (Ca,Sr)$AlSiN_3$ orange phosphor activated with Eu wherein both Ca and Sr are present, and $CaAlSiN_3$ red phosphor activated with Eu. As the yellow phosphor other than the above, for example, YAG:Ce, (Ca,Sr,Ba)$Si_2O_2N_2$:Eu wherein at least one of Ca, Sr, and Ba is present, and the like may be used.

As one aspect of the light-emitting device of the present invention, there is a light-emitting device in which a light-emitting body or an emission source emits ultraviolet light or visible light having a peak wavelength of 300 to 450 nm such that the phosphor of the present invention emits light of blue-to-red color, which is mixed with light having a wavelength of 450 nm or more emitted by the other phosphor of the present invention such that the light-emitting device emits light of a white color or light of another color other than the white color.

As one aspect of the light-emitting device of the present invention, in addition to the phosphor of the present invention, a blue phosphor emitting light having a peak wavelength of 420 nm to 500 nm or less by means of the light-emitting body or the emission source can further be included. Specific examples of such a blue phosphor include AlN: (Eu, Si) wherein both Eu and Si are present, $BaMgAl_{10}O_{17}$:Eu, $SrSi_9Al_{19}O_{31}$:Eu, $LaSi_9Al_{19}N_{32}$:Eu, α-sialon:Ce, JEM:Ce, and so on.

As one aspect of the light-emitting device of the present invention, in addition to the phosphor of the present invention, a green phosphor emitting light having a peak wavelength of 500 nm or more to 550 nm or less by means of the light-emitting body or the emission source can further be included. Specific examples of such a green phosphor include β-sialon:Eu, (Ba,Sr,Ca,Mg)$_2SiO_4$:Eu wherein at least one of Ba, Sr, Ca, and Mg is present, (Ca,Sr,Ba)$Si_2O_2N_2$:Eu wherein at least one of Ca, Sr, and Ba is present, and so on.

As one aspect of the light-emitting device of the present invention, in addition to the phosphor of the present invention, a yellow phosphor emitting light having a peak wavelength of 550 nm or more to 600 nm or less by mean of the light-emitting body or the emission source can further be included. Specific examples of such a yellow phosphor include YAG:Ce, α-sialon:Eu, $CaAlSiN_3$:Ce, $La_3Si_6N_{11}$:Ce, and so on.

As one aspect of the light-emitting device of the present invention, in addition to the phosphor of the present invention, a red phosphor emitting light having a peak wavelength of 600 nm or more to 700 nm or less by means of the light-emitting body or the emission source can further be included. Specific examples of such a red phosphor include $CaAlSiN_3$:Eu, (Ca, Sr)$AlSiN_3$:Eu wherein both Ca and Sr are present, $Ca_2Si_5N_8$:Eu, $Sr_2Si_5N_8$:Eu, and so on.

As one aspect of the light-emitting device of the present invention, a light-emitting device with high efficiency can be configured since the emission efficiency is high if an LED in which the light-emitting body or the emission source emits light having a wavelength of 320 to 450 nm is used.

An image display device of the present invention comprises at least an excitation source and a phosphor and the phosphor comprises at least the above-described phosphor of the present invention.

As the image display device, there are a fluorescent display tube (VFD), a field emission display (FED), a plasma display panel (PDP), a cathode-ray tube (CRT), a liquid crystal display (LCD), and so on. It has been confirmed that the phosphor of the present invention emits light by excitation of a vacuum ultraviolet ray of 100 to 190 nm, an ultraviolet ray of 190 to 380 nm, an electron beam, or the like, and the above image display devices can be configured by combining these excitation sources and the phosphors of the present invention.

The phosphor of the present invention comprising, as the main component, an inorganic compound having a specific chemical composition has a white color as an object color, and thus can be used as a pigment or fluorescent pigment. That is, the object color of white is observed when the phosphor of the present invention is irradiated with sunlight or light from a fluorescent lamp or the like. In view of a good coloring and no degradation over a long period of time, the phosphor of the present invention is suitable for an inorganic pigment. Therefore, when the phosphor of the present invention is used for a paint, ink, color, glaze, colorant to be added to a plastic product or the like, a favorable coloring can be maintained at a high level for a long period of time.

The phosphor of the present invention absorbs the ultraviolet ray so as to be suitable also as the ultraviolet absorber. Thus, when the phosphor of the present invention is used as the paint or applied onto a surface of the plastic product or kneaded into an inside thereof, a shielding effect thereof against the ultraviolet ray is so high that the product may be effectively protected from the ultraviolet degradation.

EXAMPLES

The present invention will be described in more detail with reference to the examples to be shown below, but these examples are disclosed only for the purpose of facilitating understanding the present invention readily such that the present invention is not limited to these examples.

[Raw Materials Used for Synthesis]

The raw material powders used for the synthesis were: silicon nitride powder with a particle size of specific surface area of 11.2 m$^2$/g, oxygen content of 1.29 wt %, and α type content of 95% (SN-E10 grade made by Ube Industries, Ltd.); aluminum nitride powder with a particle size of specific surface area of 3.3 m$^2$/g and oxygen content of 0.82 wt % (E-Grade made by Tokuyama Corporation); aluminum oxide powder with a particle size of specific surface area of 13.2 m$^2$/g (TAIMICRON made by Taimei Chemicals Co., Ltd.); lithium nitride (Li$_3$N; made by Kojundo Chemical Laboratory Co., Ltd.); strontium nitride of 99.5% purity (Sr$_3$N$_2$; made by CERAC, Inc.); barium nitride of 99.7% purity (Ba$_3$N$_2$; made by CERAC, Inc.); europium nitride (EuN; obtained by nitriding metal through heating metal europium in an ammonia vapor flow at 800° C. for 10 hours); lanthanum nitride (LaN; made by Kojundo Chemical Laboratory Co., Ltd.); and cerium nitride (CeN; obtained by heating metal cerium in a nitrogen gas flow at 600° C. for nitriding).

[Synthesis and Structure Analysis of LiBa$_2$AlSi$_7$N$_{12}$ Crystal]

A mixture composition of lithium nitride (Li$_3$N), barium nitride (Ba$_3$N$_2$), aluminum nitride (AlN), and silicon nitride (Si$_3$N$_4$) in the molar ratios of 1:2:3:7 was designed. These raw material powders were weighed to make the above mixture composition and the mixture raw material powders were mixed for 5 minutes using a pestle and a mortar made of silicon nitride sintered body in a nitrogen atmosphere including oxygen content of 1 ppm in a glovebox. Next, the thus-obtained powder mixture was fed into a crucible made of sintered boron nitride body. A bulk density of the powder mixture (powder) was approximately 30%.

The crucible containing the powder mixture was set into an electric furnace of a graphite resistance heating type. In the firing operation, first the firing atmosphere was made vacuum of 1×10$^{-1}$ Pa or less with a diffusion pump, and heated from the room temperature to 800° C. at a rate of 500° C. per hour. Nitrogen of 99.999 vol % purity was introduced at 800° C. to raise the pressure inside the furnace to 1 MPa, and the temperature was further raised to 1900° C. at a rate of 500° C. per hour, and then the temperature was maintained for two (2) hours.

Figure 3:
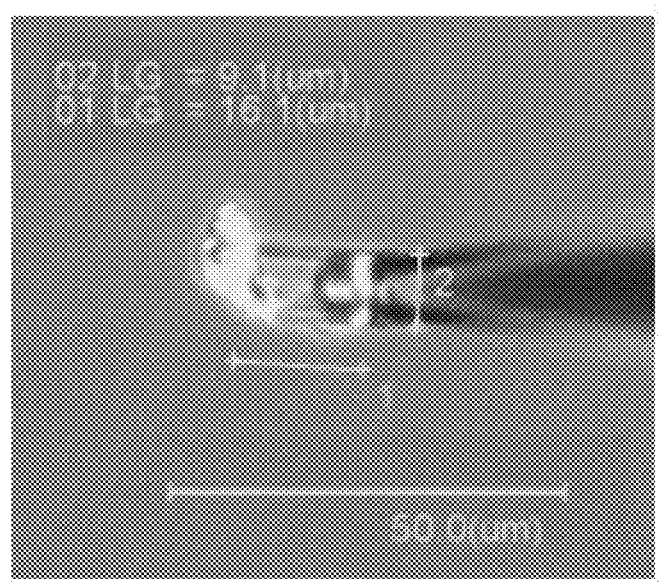
FIG. 3 shows a micrograph of a single crystal of $LiBa_2AlSi_7N_{12}$ crystal extracted from the synthesized compound.

A synthesized compound was observed by means of an optical microscope and a crystal particle having a size of 16 μm×9 μm×5 μm was collected out of the synthesized compound (refer to FIG. 3). The crystal particle was analyzed using a scanning electron microscope (SEM; SU1510 made by Hitachi High-Technologies Corp.) equipped with an energy dispersive elemental analyzer (EDS; QUANTAX made by Bruker AXS Inc.) so as to perform the elemental analysis for the elements included in the crystal particle. As a result, presence of Ba, Si, Al, and N elements was confirmed, and ratios of the respective number of contained atoms of Ba, Si, and Al were measured to be 2:7:1. Using the mass spectrometry, Li was detected. Specifically, the synthesized compound was irradiated with laser light of the wavelength of 213 nm having a beam diameter of 30 μm by the Nd: YAG laser manufactured by New Wave Research Corporation and a Li element sublimated from the synthesized compound was analyzed by the ICP mass spectrometry attached to the laser ablation device.

The crystal was fixed to a tip top of a glass fiber with an organic adhesive. An X-ray diffraction measurement of the crystal was performed under a condition in which an output of an X-ray source was 50 kV and 50 mA using a single crystal X-ray diffractometer with a rotating target of Mo Kα-line (SMART APEX II Ultra made by Bruker AXS Inc.). As a result, the crystal particle was confirmed to be a single crystal.

Next, the crystal structure of the crystal was determined using single crystal structure analysis software (APEX2 made by Bruker AXS Inc.) from the results of X-ray diffraction measurement. The crystal structure data obtained are shown in Table 1, and diagrams of the crystal structure are shown in FIG. 1. The crystal system, the space group, the lattice constants, and the kinds and positions of atoms are described in Table 1, and the shape and the size of the unit cell and the arrangement of atoms therein can be determined using the data. In addition, Si and Al enter in equivalent atom positions with a certain ratio, and oxygen and nitrogen enter in equivalent atom positions at a certain ratio, and when the ratios are averaged as a whole, the averaged ratio matches the composition fractions of the crystal.

It was found that the crystal belonged to the orthorhombic system, and belonged to the space group Pnnm (space group No. 58 of the International Tables for Crystallography), and the lattice constants a, b, and c and angles α, β, and γ were determined as follows: a=1.40941 nm; b=0.48924 nm; c=0.80645 nm; angle α=90°; β=90°; and γ=90°. Further, the atom positions were determined as shown in Table 1. Here, in the table, Si and Al exist in the equivalent atom positions with a certain ratio which should be determined by the composition thereof. Also, while oxygen and nitrogen can occupy the seats where X (X as shown in the (Li, A)$_3$(D, E)$_8$X$_{12}$ crystal. Refer to Paragraph [0083]) can sit in the sialon system crystal in general, since Li is +1 in the valence, Ba is +2, Al is +3, and Si is +4, if the atomic positions and an amount ratio of Li, Ba, Al, and Si are given, the ratio of O (−2 in the valence) and N (−3 in the valence) which occupy (O, N) positions can be determined from the condition of the electrical neutrality of the crystal. The composition of the crystal obtained from the Ba:Si:Al ratio having been measured by means of EDS, an analysis result of Li by the ICP Mass Spectrometry, and a structure analysis of the single crystal X-ray crystallography was found to be LiBa$_2$AlSi$_7$N$_{12}$. Here, there may be a case where the starting raw material composition looks different from the synthesized crystal composition as the whole phosphor, but it is thought that this may have been caused by producing another composition other than the LiBa$_2$AlSi$_7$N$_{12}$ composition as a second phase of a small amount. However, even if in such a case, the analysis results show a structure of pure LiBa$_2$AlSi$_7$N$_{12}$ because the single crystal in particular having been picked up was used in the present measurement.

When a similar composition thereof was examined, the LiBa$_2$AlSi$_7$N$_{12}$ crystal was found to allow the A element (here, A is one or two or more kinds selected from a group consisting of Mg, Ca, Sr, Ba, Sc, Y, and La) to substitute partially or entirely Ba while the crystal structure remains the same. That is, the crystal of LiA$_2$AlSi$_7$N$_{12}$ has a crystal structure identical to the crystal structure of the LiBa$_2$AlSi$_7$N$_{12}$ crystal. In particular, a stable crystal can be obtained in a wide range of substitution ratio with respect to Sr and La. Further, with respect to the crystal, it was confirmed that Al could substitute partially Si, Si could substitute partially Al, and/or oxygen could substitute partially N, and that the crystal was one of the compositions of the crystal group having the identical crystal structure to that of LiBa$_2$AlSi$_7$N$_{12}$. Further, the crystal can also be described as a composition represented by:

$$LiA_2Si_{7-x}Al_{1+x}O_xN_{12-x},$$

(where 0≤x≤4), from the condition of electrical neutrality.

From the crystal structure data, it was confirmed that the crystal was a new substance having not been reported so far. A powder X-ray diffraction pattern calculated from the crystal structure data is shown in FIG. 2. Hereafter, it is possible to determine the formation of the LiBa$_2$AlSi$_7$N$_{12}$ crystal of FIG. 1, by performing a powder X-ray diffraction measurement of the synthesized product, if the measured powder X-ray diffraction pattern is the same as in FIG. 2. Further, since the powder X-ray pattern can be calculated from values of the lattice constants obtained from the powder X-ray diffraction measurement and the crystal structure data of Table 1 with respect to what retains the same crystal structure as the LiBa$_2$AlSi$_7$N$_{12}$ system crystal and has the varied lattice constants, the formation of the LiBa$_2$AlSi$_7$N$_{12}$ system crystal can be judged by comparing the measured pattern with the calculated pattern. Here, "the measured powder X-ray diffraction pattern is the same as in FIG. 2" means that peak positions (2θ) of major peaks of the powder X-ray diffraction pattern match or substantially match.

Phosphor Examples and Comparative Example

Examples 1 to 15

According to the design compositions as shown in Tables 2 and 3, raw materials were weighed to be mixture compositions (mass ratios) as shown in Table 4. Although there may be a case in which a design composition in Tables 2 and 3 and a corresponding mixture composition in Table 4 show difference in the composition depending on the kind of each raw material to be used, the mixture composition was determined such that the amount of each metal ion matches therebetween in such a case. As the whole synthesized phosphor, a difference constituent caused by a composition difference from the crystal composition of the assumed crystal is mixed into the product (phosphor) as a second phase, but its amount is so small that the effect on the performance of the phosphor is slight. Therefore, the thus-synthesized phosphor includes a single crystal particle (a host crystal in which a solid-solution element is solid-solved may be included) such that the thus-synthesized phosphor may be included in the phosphor of the present invention. Weighed raw material powders were mixed for 5 minutes using a pestle and a mortar made of silicon nitride sintered body. Then, the powder mixture was fed into a crucible made of boron nitride sintered body. A bulk density of the powder body was approximately from 20% to 30%.

The crucible containing the powder mixture was set into an electric furnace of a graphite resistance heating type. In the firing operation, the firing atmosphere was made vacuum of 1×10$^{-1}$ Pa or less with a diffusion pump, and heated from the room temperature to 800° C. at a rate of 500° C. per hour. Nitrogen of 99.999 vol % purity was introduced at 800° C. to raise the pressure inside the furnace up to 1 MPa, and the temperature was further raised at a rate of 500° C. per hour up to the designed temperature as shown in Table 5, and then the temperature was maintained for two (2) hours.

TABLE 2

Design compositions (atomic ratio) in examples and comparative example

| Example | M element | | A element Ba | Sr | La | E element Al | D element Si | X element O | N |
|---|---|---|---|---|---|---|---|---|---|
| Comparative example 1 | | | 1 | 2 | | 1 | 7 | | 12 |
| Example 2 | Eu | 0.1 | 1 | 1.9 | | 1 | 7 | | 12 |
| Example 3 | Eu | 0.1 | 1 | 1.4 | 0.5 | 1.5 | 6.5 | | 12 |
| Example 4 | Eu | 0.1 | 1 | 1.5 | 0.4 | 1 | 7 | | 12 |
| Example 5 | Eu | 0.1 | 1 | 0.95 | 0.95 | 1 | 7 | | 12 |
| Example 6 | Eu | 0.1 | 1 | 1.9 | | 2 | 6 | 1 | 11 |
| Example 7 | Eu | 0.1 | 1 | 1.9 | | 1 | 7 | | 12 |
| Example 8 | Eu | 0.1 | 1 | 1.8 | 0.1 | 1.1 | 6.9 | | 12 |
| Example 9 | Eu | 0.1 | 1 | 1.4 | 0.5 | 1.5 | 6.5 | | 12 |
| Example 10 | Eu | 0.1 | 1 | 0.9 | 1 | 2 | 6 | | 12 |
| Example 11 | Eu | 0.1 | 1 | 1.5 | 0.4 | 1 | 7 | | 12 |
| Example 12 | Eu | 0.1 | 1 | 0.95 | 0.95 | 1 | 7 | | 12 |
| Example 13 | Eu | 0.1 | 1 | 1.9 | | 2 | 6 | 1 | 11 |
| Example 14 | Ce | 0.02 | 1 | 1.98 | | 1 | 7 | | 12 |
| Example 15 | Ce | 0.1 | 1 | 1.9 | | 2 | 6 | 1 | 11 |

TABLE 3

Design compositions (parameter) in examples and comparative example

| Example | M element (d) | Li (z) | A element Ba (e) | Sr (e) | La (e) | E element (g) Al | D element (f) Si | X element (h) O | N |
|---|---|---|---|---|---|---|---|---|---|
| Comparative example 1 | | 0.0434783 | 0.086957 | | | 0.043478261 | 0.30434783 | | 0.521739 |
| Example 2 | Eu 0.004348 | 0.0434783 | 0.082609 | | | 0.043478261 | 0.30434783 | | 0.521739 |
| Example 3 | Eu 0.004348 | 0.0434783 | 0.06087 | | 0.021739 | 0.065217391 | 0.2826087 | | 0.521739 |
| Example 4 | Eu 0.004348 | 0.0434783 | 0.065217 | 0.017391 | | 0.043478261 | 0.30434783 | | 0.521739 |
| Example 5 | Eu 0.004348 | 0.0434783 | 0.041304 | 0.041304 | | 0.043478261 | 0.30434783 | | 0.521739 |

TABLE 3-continued

Design compositions (parameter) in examples and comparative example

| Example | M element (d) | Li (z) | A element Ba (e) | Sr (e) | La (e) | E element (g) Al | D element (f) Si | X element (h) O | N |
|---|---|---|---|---|---|---|---|---|---|
| Example 6 | Eu | 0.004348 | 0.0434783 | 0.082609 | | | 0.086956522 | 0.26086957 | 0.043478 | 0.478261 |
| Example 7 | Eu | 0.004348 | 0.0434783 | 0.082609 | | | 0.043478261 | 0.30434783 | | 0.521739 |
| Example 8 | Eu | 0.004348 | 0.0434783 | 0.078261 | | 0.004348 | 0.047826087 | 0.3 | | 0.521739 |
| Example 9 | Eu | 0.004348 | 0.0434783 | 0.06087 | | 0.021739 | 0.065217391 | 0.2826087 | | 0.521739 |
| Example 10 | Eu | 0.004348 | 0.0434783 | 0.03913 | | 0.043478 | 0.086956522 | 0.26086957 | | 0.521739 |
| Example 11 | Eu | 0.004348 | 0.0434783 | 0.065217 | 0.017391 | | 0.043478261 | 0.30434783 | | 0.521739 |
| Example 12 | Eu | 0.004348 | 0.0434783 | 0.041304 | 0.041304 | | 0.043478261 | 0.30434783 | | 0.521739 |
| Example 13 | Eu | 0.004348 | 0.0434783 | 0.082609 | | | 0.086956522 | 0.26086957 | 0.043478 | 0.478261 |
| Example 14 | Ce | 0.00087 | 0.0434783 | 0.086087 | | | 0.043478261 | 0.30434783 | | 0.521739 |
| Example 15 | Ce | 0.004348 | 0.0434783 | 0.082609 | | | 0.086956522 | 0.26086957 | 0.043478 | 0.478261 |

TABLE 4

Raw material mixture compositions (mass ratios) in examples and comparative example

| Example | Si3N4 | AlN | Al2O3 | Li3N | Sr3N2 | Ba3N2 | LaN | EuN | CeN |
|---|---|---|---|---|---|---|---|---|---|
| Comparative example 1 | 48.62 | 6.09 | | 1.72 | | 43.57 | | | |
| Example 2 | 48.48 | 6.07 | | 1.72 | | 41.27 | | 2.46 | |
| Example 3 | 45.00 | 9.10 | | 1.72 | | 30.40 | 11.32 | 2.46 | |
| Example 4 | 49.95 | 6.26 | | 1.77 | 5.92 | 33.57 | | 2.53 | |
| Example 5 | 52.12 | 6.53 | | 1.85 | 14.67 | 22.19 | | 2.64 | |
| Example 6 | 41.50 | 8.09 | 5.03 | 1.72 | | 41.22 | | 2.46 | |
| Example 7 | 48.48 | 6.07 | | 1.72 | | 41.27 | | 2.46 | |
| Example 8 | 47.78 | 6.68 | | 1.72 | | 39.10 | 2.27 | 2.46 | |
| Example 9 | 45.00 | 9.10 | | 1.72 | | 30.40 | 11.32 | 2.46 | |
| Example 10 | 41.52 | 12.13 | | 1.72 | | 19.53 | 22.63 | 2.46 | |
| Example 11 | 49.95 | 6.26 | | 1.77 | 5.92 | 33.57 | | 2.53 | |
| Example 12 | 52.12 | 6.53 | | 1.85 | 14.67 | 22.19 | | 2.64 | |
| Example 13 | 41.50 | 8.09 | 5.03 | 1.72 | | 41.22 | | 2.46 | |
| Example 14 | 48.61 | 6.09 | | 1.72 | | 43.12 | | | 0.46 |
| Example 15 | 41.57 | 8.10 | 5.04 | 1.72 | | 41.29 | | | 2.28 |

TABLE 5

Firing conditions in examples and comparative example

| Example | Temperature (° C.) | Ambient pressure (Mpa) | Time (hour) |
|---|---|---|---|
| Comparative example 1 | 1700 | 1 | 2 |
| Example 2 | 1700 | 1 | 2 |
| Example 3 | 1700 | 1 | 2 |
| Example 4 | 1700 | 1 | 2 |
| Example 5 | 1700 | 1 | 2 |
| Example 6 | 1700 | 1 | 2 |
| Example 7 | 1700 | 1 | 2 |
| Example 8 | 1800 | 1 | 2 |
| Example 9 | 1800 | 1 | 2 |
| Example 10 | 1800 | 1 | 2 |
| Example 11 | 1800 | 1 | 2 |
| Example 12 | 1800 | 1 | 2 |
| Example 13 | 1800 | 1 | 2 |
| Example 14 | 1800 | 1 | 2 |
| Example 15 | 1900 | 1 | 2 |

Figure 4:
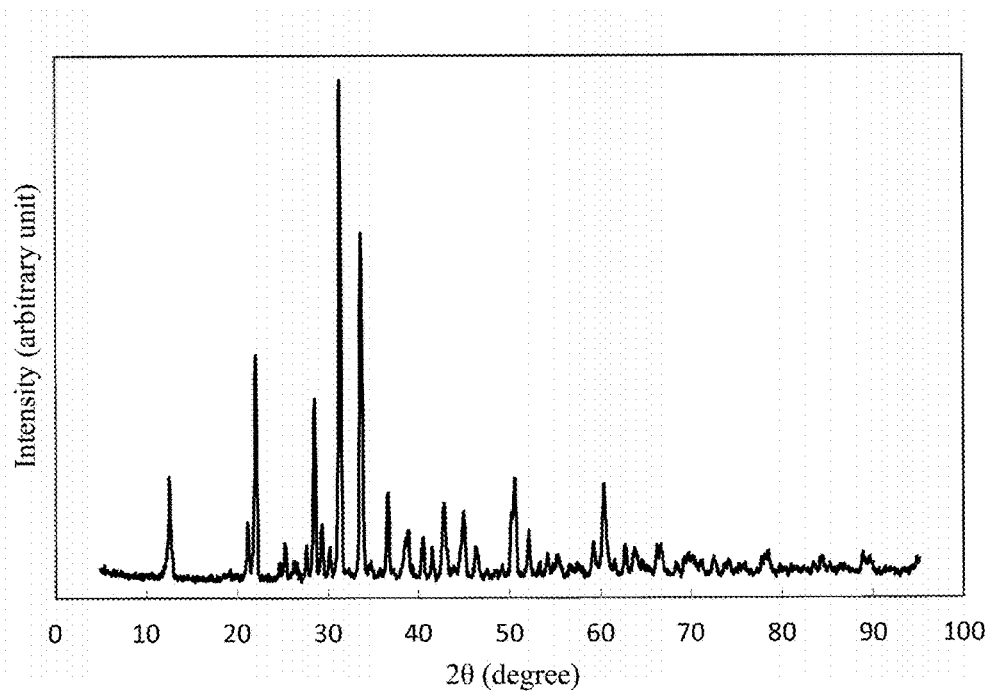
FIG. 4 is a diagram showing a resultant powder X-ray diffraction pattern of a synthesized compound synthesized in Example 6.

Next, each synthesized compound was ground using an agate mortar and the powder X-ray diffraction measurement using Cu Kα-line was carried out. The result is shown in FIG. 4. Main formation phases are shown in Table 6. Also, the elements included in the synthesized compound were investigated by the EDS measurement and the ICP mass spectrometry. It was confirmed that the synthesized compounds of Examples 2-5, 7-12, and 14 included at least a rare earth element, alkaline earth metal, Si, Al, Li, and N. It was confirmed that the synthesized compounds of Examples 6, 13, and 15 included a rare earth element, alkaline earth metal, Si, Al, Li, O, and N.

FIG. 4 is a diagram showing a resultant powder X-ray diffraction pattern of a synthesized compound synthesized in Example 6.

The powder X-ray diffraction result of the synthesized compound (FIG. 4) matches the structure analysis result (FIG. 2) very well such that the X-ray diffraction pattern of the synthesized compound of Example 6 is the same as the X-ray diffraction pattern of the LiBa$_2$AlSi$_7$N$_{12}$ crystal such that it was found that the crystal having the identical crystal structure to that of the LiBa$_2$AlSi$_7$N$_{12}$ crystal had been obtained. For example, peaks at 2θ=31.40, 33.65, 29.37, 22.11, 12.63, 36.71, 43.22, 52.23, 60.43, and 21.22 in FIG. 2 correspond to peaks at 2θ=31.35, 33.65, 28.5, 22.05, 12.6, 36.65, 43.05, 52.15, 60.35, and 21.15 in FIG. 4, respectively, although there are some cases in which the order of heights of intensities of the peaks was partially reversed, such that a good match is shown. Here, the deviation in the angle, 2θ, was assumed ±1 degree. Further, it was confirmed that the synthesized compound of Example 6 included Eu, Ba, Si, Al, O, and N from the EDS measurement. It was confirmed that the ratio of Ba:Si:Al was 2:6:2. Also, the existence of Li was confirmed by the measurement of a combination of later ablation and CIP-MASS. From the above, it was confirmed that the synthesized compound of Example 6 was an inorganic compound in which Eu is solid-solved in the $LiBa_2(Al, Si)_8(O, N)_{12}$ crystal (more specifically, $LiBa_2Al_2Si_6ON_{11}$). Although not shown herein with respect to the other Examples, similar X-ray diffraction patterns were obtained. The following shows results of comparison with respect to ten (10) major peaks thereof corresponding to respective major peaks in FIG. 2 in the same way.

TABLE 6

Main formation phases in examples and comparative example

| | Main formation phases | |
|---|---|---|
| Example | Main phase | Sub phase |
| Comparative example 1 | $LiBa_2AlSi_7N_{12}$ | $SrSi_7N_{10}$ |
| Example 2 | $LiBa_2AlSi_7N_{12}$ | $Sr_2Si_5N_8$, $BaSi_6ON_8$ |
| Example 3 | $LiBa_2AlSi_7N_{12}$ | $Ba_5Al_7Si_{11}N_{25}$ |
| Example 4 | $LiBa_2AlSi_7N_{12}$ | $Sr_2Si_5N_8$, $SrSi_7N_{10}$ |
| Example 5 | $LiBa_2AlSi_7N_{12}$ | $Sr_2Si_5N_8$, $SrAl_2Si_2O_8$ |
| Example 6 | $LiBa_2AlSi_7N_{12}$ | $SrSi_7N_{10}$ |
| Example 7 | $LiBa_2AlSi_7N_{12}$ | $Sr_2Si_5N_8$, $SiO_2$, $\beta$-$Si_3N_4$ |
| Example 8 | $LiBa_2AlSi_7N_{12}$ | $Sr_2Si_5N_8$ |
| Example 9 | $LiBa_2AlSi_7N_{12}$ | $LiEu_4Al_8Si_{11}O_{10}N_{19}$, $Ba_5Al_7Si_{11}N_{25}$ |
| Example 10 | $LiBa_2AlSi_7N_{12}$ | $LiEu_4Al_8Si_{11}O_{10}N_{19}$, $La_4Si_2O_7N_2$ |
| Example 11 | $LiBa_2AlSi_7N_{12}$ | $Sr_2Si_5N_8$ |
| Example 12 | $LiBa_2AlSi_7N_{12}$ | $Sr_2Si_5N_8$ |
| Example 13 | $LiBa_2AlSi_7N_{12}$ | $Al_2SiO_5$, $SrSi_7N_{10}$ |
| Example 14 | $LiBa_2AlSi_7N_{12}$ | $Sr_2Si_5N_8$ |
| Example 15 | $LiBa_2AlSi_7N_{12}$ | $BaSi_6ON_8$, $Sr_2Si_5N_8$, $Sr_3Si_8O_7N_8$ |

As shown in Table 6, it was confirmed that the synthesized compounds of the examples according to the present invention had 20 mass % or more of a phase having the same crystal structure as $LiBa_2AlSi_7N_{12}$ crystal as the main formation phase. It is suggested that a portion in which a raw material mixture composition and a chemical composition of the synthesized compound show discrepancy indicates a trace amount of substance mixed in the synthesized compound as an impurity secondary phase. Here, although no oxides were used as raw materials, oxide or oxynitride was detected as a sub phase, which may be thought to have been caused by impurity oxygen in the raw materials.

From the aforementioned, it was confirmed that the synthesized compounds of examples according to the present invention included an inorganic compound as a main component comprising the $LiBa_2AlSi_7N_{12}$ system crystal into which the activating ion M such as Eu and Ce was solid-solved.

After firing, the thus-obtained synthesized compound (sintered body) was crushed coarsely and further ground by hand using a crucible and mortar made of silicon nitride sintered body, and then allowed to pass a 30 μm-mesh sieve. When the particle size distribution was measured, the mean particle diameter was 3 to 8 μm.

Figure 5:
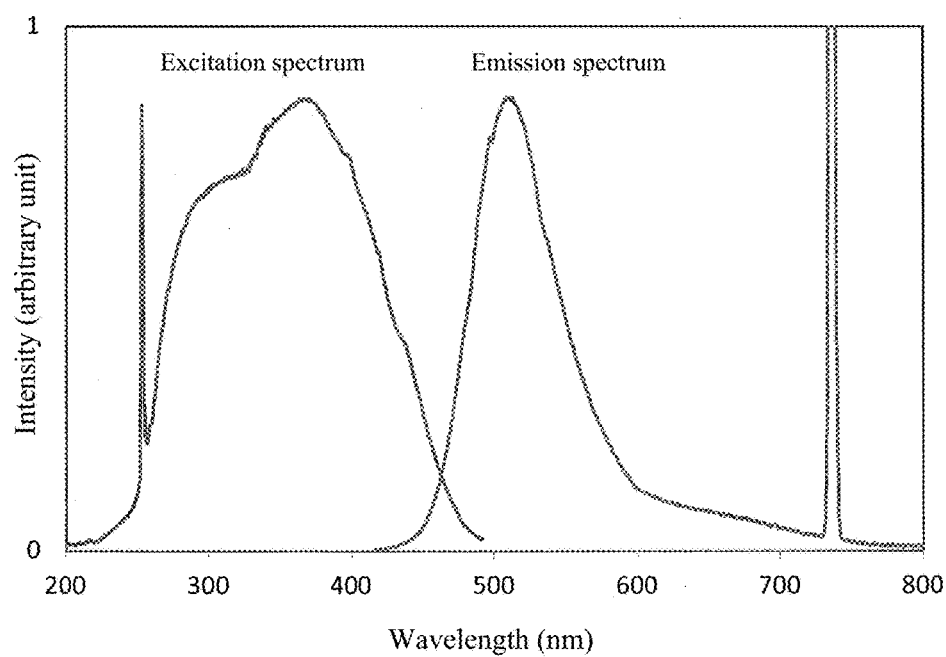
FIG. 5 is a diagram showing an excitation spectrum and an emission spectrum of a synthesized compound synthesized in Example 6.

As a result of irradiating light of wavelength of 365 nm emitted by the lamp onto these powder samples, it was confirmed that these powder samples emitted light of blue-to-red color. An emission spectrum and an excitation spectrum of the powder were measured using a spectrophotofluorometer. The result is shown in FIG. 5. Peak wavelengths of the excitation spectra and peak wavelengths of the emission spectra are shown in Table 7.

FIG. 5 is a diagram showing an excitation spectrum and an emission spectrum of a synthesized compound synthesized in Example 6.

TABLE 7

Excitation emission characteristics in examples and comparative example

| Example | Excitation peak wavelength (nm) | Emission peak wavelength (nm) | Emission intensity (arbitrary unit) |
|---|---|---|---|
| Comparative example 1 | | | Not emitted |
| Example 2 | 366 | 506 | 0.84 |
| Example 3 | 365 | 512 | 0.89 |
| Example 4 | 442 | 651 | 0.94 |
| Example 5 | 441 | 637 | 0.99 |
| Example 6 | 367 | 511 | 0.86 |
| Example 7 | 367 | 505 | 0.6 |
| Example 8 | 360 | 506 | 0.33 |
| Example 9 | 368 | 508 | 0.45 |
| Example 10 | 359 | 507 | 0.23 |
| Example 11 | 448 | 642 | 0.54 |
| Example 12 | 440 | 633 | 0.53 |
| Example 13 | 369 | 508 | 0.56 |
| Example 14 | 278 | 478 | 0.07 |
| Example 15 | 440 | 583 | 0.09 |

According to FIG. 5, it was found that the synthesized compound of Example 6 could have been excited at 367 nm most efficiently, and that the emission spectrum upon excitation of 367 nm had a peak at 511 nm and exhibited green emission. Further, an emission color of the synthesized compound of Example 6 was confirmed to be within the following range: $0 \leq x0 \leq 0.5$, and $0.1 \leq y0 \leq 0.9$ in the CIE 1931 chromaticity coordinates.

According to Table 7, it was confirmed that the synthesized compounds of the present invention could be excited by an ultraviolet ray of 300 nm to 380 nm and violet or blue light of 380 nm to 450 nm and were phosphors to emit blue-to-red light.

As mentioned above, it was found that the synthesized compounds of examples according to the present invention included an inorganic compound as a main component comprising the $LiBa_2AlSi_7N_{12}$ system crystal into which the activating ion M such as Eu and Ce was solid-solved and that the inorganic compound was a phosphor.

Further, according to Tables 3 and 7, it should be understood that a phosphor exhibiting blue-to-red color emission can be obtained by controlling the composition in a specific composition. For example, as shown with respect to the synthesized compounds of Examples 2, 3, 6-10, and 13, phosphors including inorganic compounds comprising crystals in which Eu is solid-solved as the M element, wherein the crystals are characterized in that the A element is Ba or a combination of Ba and La, the D element is Si, the E element is Al, and the X element is N or a combination of N and O, emit green light having peaks at wavelengths in the range of at least 500 nm and not exceeding 550 nm, more preferably, in the range of at least 500 nm and not exceeding 520 nm. As shown with respect to the synthesized compounds of Examples 4, 5, 11, and 12, phosphors including inorganic compounds comprising crystals in which Eu is solid-solved as the M element, wherein the crystals are characterized in that the A element is a combination of Ba and Sr, the D element is Si, the E element is Al, and the X element is N or a combination of N and O, emit red light having peaks at wavelengths in the range of at least 620 nm and not exceeding 670 nm.

Here, a portion in which a raw material mixture composition and a chemical composition of the synthesized compound show discrepancy has a trace amount of substance mixed in the synthesized compound as an impurity secondary phase.

Although not shown in the drawings, it was confirmed that the synthesized compounds obtained in Examples 1-15 had a white color as an object color and was excellent in the coloration. The inorganic compounds of the synthesized compounds according to the present invention exhibited the object color of white by irradiation of the sunlight or an illumination such as a fluorescent lamp such that it was found that they could be utilized for the pigment or the fluorescent pigment.

Examples of Light-Emitting Device and Image Display Device

Examples 16 to 19

Next, a light-emitting device utilizing the phosphor of the present invention will be described.

Example 16

Figure 6:
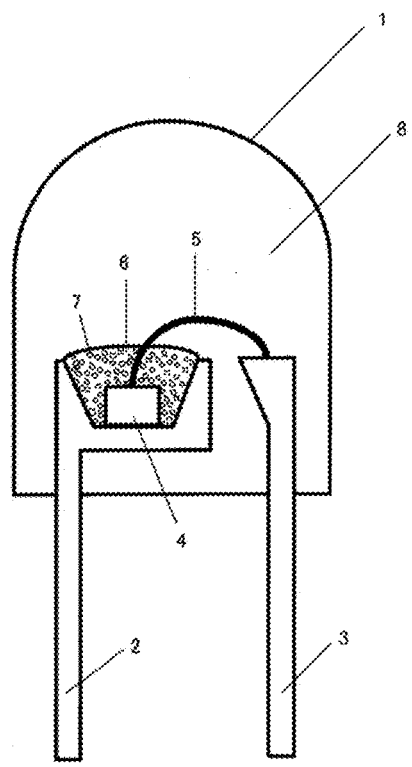
FIG. 6 is a schematic diagram showing an illuminating device (bullet-type of LED illuminating device) according to the present invention.

FIG. 6 is a schematic diagram showing an illuminating device (bullet-type of LED illuminating device) according to the present invention.

A so-called bullet-type white light-emitting diode lamp (1) shown in FIG. 6 was produced. There are two lead wires (2, 3), one of which (2) has a recess, in which an ultraviolet light-emitting diode element (4) having an emission peak of 365 nm is placed. The lower electrode of the ultraviolet light-emitting diode element (4) and the bottom surface of the recess are electrically connected with conductive paste, and the upper electrode and the other lead wire (3) are electrically connected through a gold thin wire (5). The phosphor (7) is dispersed in resin and mounted in the vicinity of the light-emitting diode element (4). The first resin (6) in which this phosphor is dispersed is transparent, and covers the entire ultraviolet light-emitting diode element (4). The tip-top portion of the lead wire including the recess, the violet light-emitting diode element, and the first resin in which the phosphor is dispersed are sealed with transparent second resin (8). A second resin (8) which is transparent is formed approximately in a cylindrical shape as a whole and the top portion is rounded in a lens shape such that the lamp is generally referred to as a bullet-type.

In the present embodiment, a phosphor powder prepared by mixing the red phosphor prepared for Example 4, the green phosphor prepared for Example 6, a blue phosphor of α-sialon:Ce was mixed into epoxy resin at the concentration of 35 wt %, and this resultant mixture was dropped in an appropriate amount with a dispenser such that the first resin (6) was formed to have blended phosphor (7) dispersed therein. The light emitted by the thus-obtained light-emitting device had an emission color of white and characterized by x=0.33 and y=0.33 in the color coordinates.

Example 17

Figure 7:
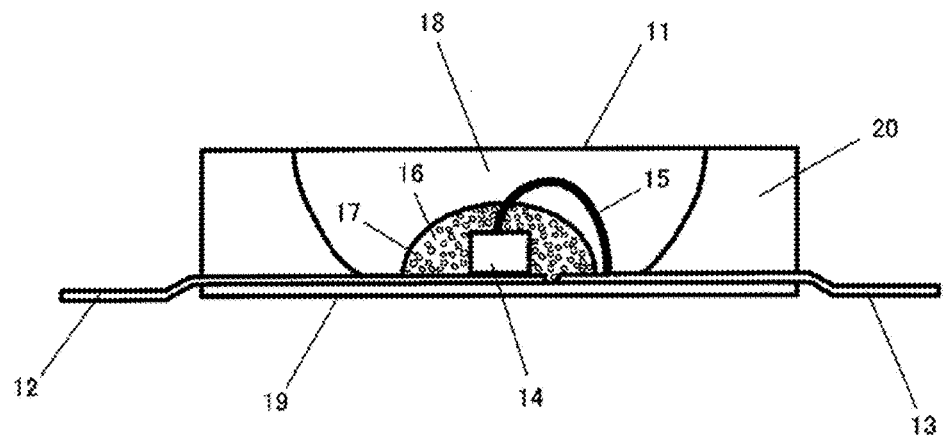
FIG. 7 is a schematic diagram showing an illuminating device (board-mounting-type LED illuminating device) according to the present invention.

FIG. 7 is a schematic diagram showing an illuminating device (board-mounting-type LED illuminating device) according to the present invention.

A chip-type white light-emitting diode lamp (11) for board-mounting as shown in FIG. 7 was produced. Two lead wires (12, 13) are fixed to a white alumina ceramic board (19) having high reflectance of visible light and one end of each of the wires is located at approximately the center portion of the board and the other end of each of the wires extends outside to serve as an electrode to be soldered when the lamp is mounted on the electric board. One of the lead wires (12) has the one end on which an blue light-emitting diode element (14) having an emission peak wavelength of 450 nm is placed and fixed thereto such that the element is located at the center of the board. The lower electrode of the blue light-emitting diode element (14) and the lead wire below are electrically connected with conductive paste, and the upper electrode and the other lead wire (13) are electrically connected with a bonding wire (15) of a gold thin wire.

A material prepared by mixing the first resin (16) and a blended phosphor (17) prepared by blending the green phosphor prepared for Example 6 and the red phosphor prepared for Example 4 is mounted in the vicinity of the light-emitting diode element. The first resin in which this phosphor is dispersed is transparent, and covers the entire blue light-emitting diode element (14). Also, a wall surface member (20) having a hole opened at the center portion is fixed to the ceramic board. The wall surface member (20) has the center portion formed as the hole in which the blue light-emitting diode element (14) and the resin (16) having the phosphor (17) dispersed therein are contained and the portion of the hole facing the center is made to be a slope. This slope is a reflective surface for taking out light forward, and the shape of the curved surface of the slope is determined in consideration of the direction of light reflection. Further, at least the surface which constitutes the reflective surface forms a surface having high visible light reflectance with white color or metallic luster. In the present example, the wall surface member (20) is configured with white silicone resin. The hole at the center portion of the wall surface member is formed with a recess as the final shape of the chip-type light emitting diode lamp, and is filled up with second transparent resin (18) to seal all of the blue light-emitting diode element (14) and the first resin (16) in which the phosphor (17) is dispersed. In the present example, the same epoxy resin was used for both the first resin (16) and second resin (18). The attained chromaticity and the like are approximately identical to those in Example 17.

Next, an example of design of an image display device using the phosphor of the present invention will be described.

Example 18

Figure 8:
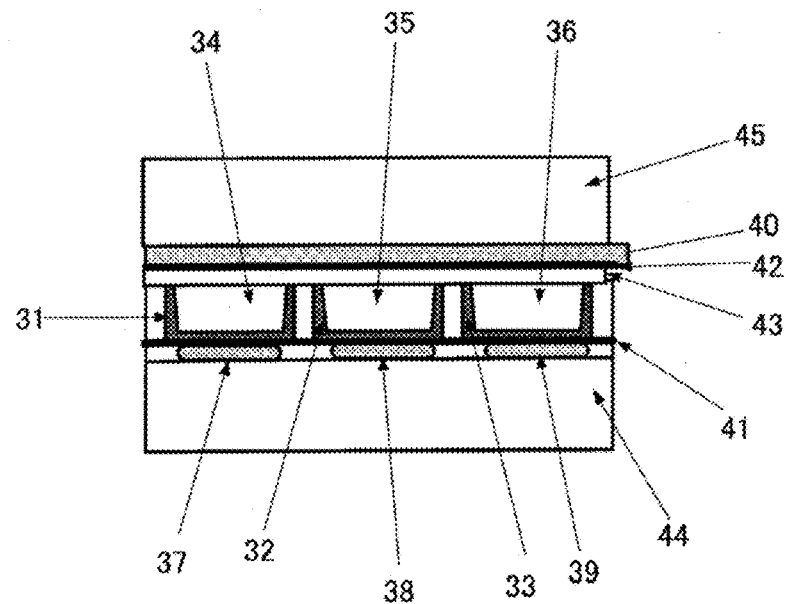
FIG. 8 is a schematic diagram showing an image display device (plasma display panel) according to the present invention.

FIG. 8 is a schematic diagram showing an image display device (plasma display panel) according to the present invention.

The red phosphor (31) of Example 4 according to the present invention, the green phosphor (32) of Example 6 according to the present invention, and the blue phosphor (BAM:$Eu^{2+}$) (33) are applied to inner surfaces of the respective cells (34, 35, 36), which are arranged via electrodes (37, 38, 39) and a dielectric layer (41) over a glass board (44). If electric power is supplied to the electrodes (37, 38, 39, 40), a vacuum ultraviolet ray is generated by Xe discharge in each of the cells, thereby exciting the respective phosphors so as to emit visible light of a red color, a green color, or a blue color such that the emitted light may be observed from the outside through a protective layer (43), a dielectric layer (42), and a glass substrate (45) so as to serve as an image display.

Example 19

Figure 9:
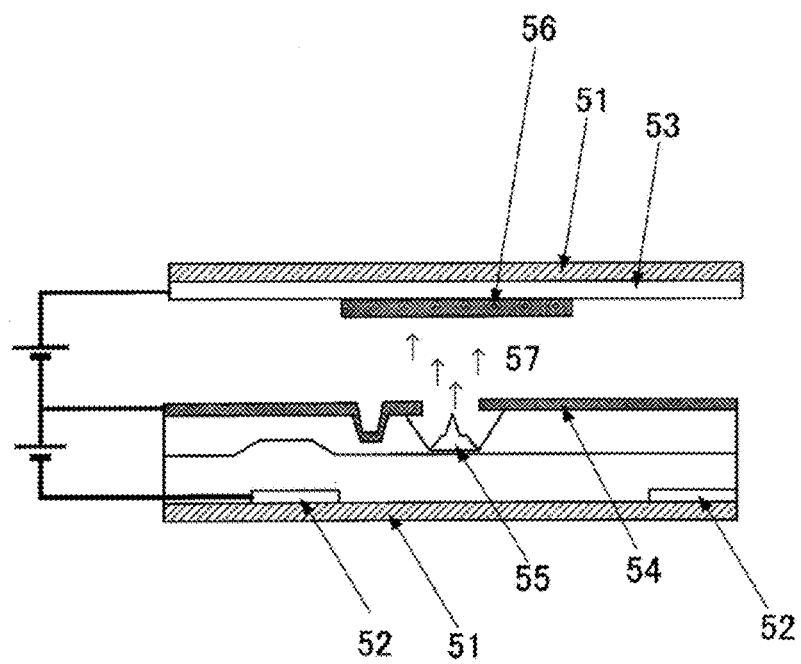
FIG. 9 is a schematic diagram showing an image display device (field emission display panel) according to the present invention.

FIG. 9 is a schematic diagram showing an image display device (field emission display panel) according to the present invention.

The green phosphor (56) of Example 3 of the present invention is applied to an interior surface of an anode (53). By applying a voltage between a cathode (52) and a gate (54), electrons (57) are emitted from an emitter (55). The electrons are accelerated by the voltage between the anode (53) and cathode (52), and impinge on the green phosphor (56) to excite the phosphor to emit light. The entire device is protected by a glass (51). Although the drawing shows a single light emission cell comprising one emitter and one phosphor, a display is actually configured to emit light of a variety of color by arranging many cells for a red color and a blue color in addition to for a green color. Although the phosphors used for red and blue cells are not particularly specified, phosphors which show high brightness under low-voltage electron beams are preferable.

INDUSTRIAL APPLICABILITY

The phosphor of the present invention has different emission characteristics (emission color and excitation characteristics, emission spectrum) from those of the conventional phosphor, exhibits high emission intensity in the case where it is combined with a LED of 470 nm or less, is chemically and thermally stable, and further has little degradation in the intensity of the phosphor when it is exposed to the excitation source for a long period of time such that it is a phosphor to be used suitably for the VFD, the FED, the PDP, the CRT, and the white LED. It is expected that the phosphor of the present invention will be utilized in material design in various kinds of display devices so as to contribute to the development of the industry.

EXPLANATION OF NUMERALS 1 bullet-type emission diode lamp.
2, 3 lead wire.
4 light-emitting diode element.
5 bonding wire.
6, 8 resin.
7 phosphor.
11 chip-type white light-emitting diode lamp for board-mounting.
12, 13 lead wire.
14 light-emitting diode element.
15 bonding wire.
16, 18 resin.
17 phosphor.
19 alumina ceramic board.
20 wall surface member.
31 red phosphor.
32 green phosphor.
33 blue phosphor.
34, 35, 36 ultraviolet ray emission cell.
37, 38, 39, 40 electrode.
41, 42 dielectric layer.
43 protective layer.
44, 45 glass substrate.
51 glass.
52 cathode.
53 anode.
54 gate.
55 emitter.
56 phosphor.
57 electrons.

What is claimed is:

1. A phosphor comprising:
an inorganic compound comprising:
a crystal represented by $LiBa_2AlSi_7N_{12}$,
an inorganic crystal having a same crystal structure as a crystal structure of a crystal represented by $LiBa_2AlSi_7N_{12}$, or
a solid solution crystal of these crystals, which comprises at least a Li element, an A element, a D element, an E element, and an X element (here, A is at least one kind of element selected from a group consisting of Mg, Ca, Sr, Ba, Sc, Y, and La; D is at least one kind of element selected from a group consisting of Si, Ge, Sn, Ti, Zr, and Hf; E is at least one kind of element selected from a group consisting of B, Al, Ga, and In; X is at least one kind of element selected from a group consisting of O, N, and F), into which an M element is solid-solved (here, M is at least one kind of element selected from a group consisting of Mn, Ce, Pr, Nd, Sm, Eu, Tb, Dy, and Yb)
wherein the inorganic crystal is represented by $(Li, A)_3(D, E)_8 X_{12}$ wherein both Li and A are present and both D and E are present, respectively.

2. The phosphor according to claim 1, wherein the inorganic crystal having the same crystal structure as the crystal structure of the crystal represented by $LiBa_2AlSi_7N_{12}$ comprises: at least Ba as the A element, Si as the D element, Al as the E element and N as the X element, and O as the X element if necessary.

3. The phosphor according to claim 1, wherein the inorganic crystal having the same crystal structure as the crystal structure of the crystal represented by $LiBa_2AlSi_7N_{12}$ is $Li(Ba, La)_2(Al, Si)_8(O, N)_{12}$, $Li(Ba, Sr)_2(Al, Si)_8(O, N)_{12}$, or $LiBa_2(Al, Si)_8(O, N)_{12}$ wherein both Ba and La are present, both Al and Si are present, both O and N are present, and both Ba and Sr are present in respective parentheses.

4. The phosphor according to claim 1, wherein the inorganic crystal having the same crystal structure as the crystal structure of the crystal represented by $LiBa_2AlSi_7N_{12}$ is represented by a composition formula of $LiBa_2Si_{7-x}Al_{1+x}O_xN_{12-x}$, $Li(Ba, La)_2Si_{7-x}Al_{1+x}O_xN_{12-x}$, or $Li(Ba, Sr)_2Si_{7-x}Al_{1+x}O_xN_{12-x}$ (where 0≤x≤4) wherein both Ba and La are present and both Ba and Sr are present in respective parentheses.

5. The phosphor according to claim 1, wherein the M element is Eu.

6. The phosphor according to claim 1, wherein the inorganic crystal having the same crystal structure as the crystal structure of the crystal represented by $LiBa_2AlSi_7N_{12}$ is a crystal in an orthorhombic system.

7. The phosphor according to claim 1, wherein the inorganic crystal having the same crystal structure as the crystal structure of the crystal represented by $LiBa_2AlSi_7N_{12}$ is a crystal in an orthorhombic system and has a symmetry in a space group Pnnm, and lattice constants a, b, and c have values in ranges:
a = 1.40941±0.05 nm;
b = 0.48924±0.05 nm; and
c = 0.80645±0.05 nm.

8. The phosphor according to claim 1,
wherein the inorganic compound is represented by a composition formula of $Li_z M_d A_e D_f E_g X_h$ (where z+d+e+f+g+h=1 in the formula; M is at least one kind of element selected from a group consisting of Mn, Ce, Pr, Nd, Sm, Eu, Tb, Dy, and Yb; A is at least one kind of element selected from a group consisting of Mg, Ca, Sr, Ba, Sc, Y, and La; D is at least one kind of element selected from a group consisting of Si, Ge, Sn, Ti, Zr, and Hf; E is at least one kind of element selected from a group consisting of B, Al, Ga, and In; and X is at least one kind of element selected from a group consisting of O, N, and F) and wherein the parameters z, d, e, f, g, and h satisfy all conditions:

$0.035 \leq z \leq 0.05$;

$0.00001 \leq d \leq 0.05$;

$0.05 \leq e \leq 0.1$;

$0.2 \leq f \leq 0.4$;

$0.03 \leq g \leq 0.1$; and $0.45 \leq h \leq 0.6$.

9. The phosphor according to claim 8, wherein values of the parameters z, d, e, f, g, and h are within a range satisfying all conditions of:

$z+d+e=(3/23)\pm 0.05$;

$f+g=(8/23)\pm 0.05$; and $h=(12/23)\pm 0.05$.

10. The phosphor according to claim 8, wherein values of the parameters f and g satisfy a condition of:

$5/8 < f/(f+g) < 1$.

11. The phosphor according to claim 8, wherein:
the X element includes N and O,
the inorganic compound is represented by a composition formula of $Li_zM_dA_eD_fE_gO_{h1}N_{h2}$ (where $z+d+e+f+g+h1+h2=1$, and $h1+h2=h$ in the formula), and
a condition of: $0 < h1/(h1+h2) \leq 4/12$ is satisfied.

12. The phosphor according to claim 8, wherein the M element includes at least Eu.

13. The phosphor according to claim 8, wherein:
the A element at least includes Ba;
the D element includes Si;
the E element includes Al; and
the X element includes N, and
the X element includes O if necessary.

14. The phosphor according to claim 1, wherein the inorganic compound is represented by a composition formula, with parameters x and y, of:
$Eu_yLiBa_{2-y}Si_{7-x}Al_{1+x}N_{12-x}O_x$,
$Eu_yLi(Ba, La)_{2-y}Si_{7-x}Al_{1+x}N_{12-x}O_x$ wherein both Ba and La are present, or
$Eu_yLi(Ba, Sr)_{2-y}Si_{7-x}Al_{1+x}N_{12-x}O_x$ wherein both Ba and Sr are present,
wherein $0 \leq x \leq 4$, and $0.0001 \leq y < 2$.

15. The phosphor according to claim 1, wherein the phosphor emits fluorescent having a peak in a wavelength range from 500 nm to 550 nm upon irradiation of an excitation source.

16. The phosphor according to claim 15, wherein the excitation source is an electron beam; an X-ray or light having a wavelength that is at least 100 nm and not exceeding 450 nm, the light being a vacuum ultraviolet ray, an ultraviolet ray or visible light.

17. The phosphor according to claim 1, wherein:
Eu is solid-solved into the crystal represented by $LiBa_2AlSi_7N_{12}$ or the inorganic crystal having a same crystal structure as the crystal structure of the crystal represented by $LiBa_2AlSi_7N_{12}$; and
the phosphor emits fluorescent of green color having an emission peak in a wavelength range of at least 500 nm and not exceeding 550 nm upon irradiation of light having a wavelength from 360 nm to 450 nm.

18. The phosphor according to claim 1, wherein a color of light emitted upon irradiation of an excitation source satisfies conditions:

$0 \leq x0 \leq 0.5$; and $0.1 \leq y0 \leq 0.9$ in terms of values of (x0, y0) of CIE 1931 chromaticity coordinates.

19. A method of manufacturing a phosphor recited in claim 1 comprising:
firing a raw material mixture of metal compounds in an inert atmosphere including nitrogen in a temperature range of at least 1,200° C. and not exceeding 2,200° C. wherein the raw material mixture could constitute an inorganic compound by firing the mixture,
wherein the inorganic compound comprises:
a crystal represented by $LiBa_2AlSi_7N_{12}$,
an inorganic crystal having a same crystal structure as a crystal structure of a crystal represented by $LiBa_2AlSi_7N_{12}$, or
a solid solution crystal of these crystals, which comprises at least a Li element, an A element, a D element, an E element, and an X element (here, A is at least one kind of element selected from a group consisting of Mg, Ca, Sr, Ba, Sc, Y, and La; D is at least one kind of element selected from a group consisting of Si, Ge, Sn, Ti, Zr, and Hf; E is at least one kind of element selected from a group consisting of B, Al, Ga, and In; X is at least one kind of element selected from a group consisting of O, N, and F), into which an M element is solid-solved (here, M is at least one kind of element selected from a group consisting of Mn, Ce, Pr, Nd, Sm, Eu, Tb, Dy, and Yb)
wherein the inorganic crystal is represented by $(Li, A)_3(D, E)_8X_{12}$ wherein both Li and A are present and both D and E are present.

20. A light-emitting device comprising:
at least a light-emitting body or light-emitting source and a phosphor,
wherein the phosphor comprises at least a phosphor recited claim 1.

21. The light-emitting device according to claim 20, wherein the light-emitting body or light-emitting source is an organic EL light-emitting body (OLED), a semiconductor laser, a laser diode (LD), or a light-emitting diode (LED) wherein any of the organic EL light-emitting body (OLED), the semiconductor laser, the laser diode (LD), and the light-emitting diode (LED) emits light of a wavelength of 330 to 500 nm.

22. The light-emitting device according to claim 20, wherein the light-emitting device is a white light-emitting diode, an illuminating device including a plurality of the white light-emitting diodes, or a backlight for a liquid crystal panel.

23. The light-emitting device according to claim 20, wherein:
the light-emitting body or light-emitting source emits ultraviolet or visible light having a peak wavelength of 300 to 450 nm and white light or light other than the white light is emitted by mixing blue-to-red light emitted by
a phosphor comprising:
an inorganic compound comprising:
a crystal represented by $LiBa_2AlSi_7N_{12}$,
an inorganic crystal having a same crystal structure as a crystal structure of a crystal represented by $LiBa_2AlSi_7N_{12}$, or
a solid solution crystal of these crystals, which comprises at least a Li element, an A element, a D element, an E element, and an X element (here, A is at least one kind of element selected from a group consisting of Mg, Ca, Sr, Ba, Sc, Y, and La; D is at least one kind of element selected from a group consisting of Si, Ge, Sn, Ti, Zr, and Hf; E is at least one kind of element selected from a group consisting of B, Al, Ga, and In; X is at least one kind of element selected from a group consisting of O, N, and F), into which an M element is solid-solved (here, M is at least one kind of element selected from a group consisting of Mn, Ce, Pr, Nd, Sm, Eu, Tb, Dy, and Yb)
wherein the inorganic crystal is represented by $(Li, A)_3(D, E)_8X_{12}$ wherein both Li and A are present and both D and E are present, and
light having a wavelength of 450 nm or more emitted by another phosphor
wherein the phosphor and the other phosphor are selectively chosen to determine which light is emitted by the light-emitting body or light-emitting source.

24. The light-emitting device according to claim 20, wherein the phosphor further comprises a blue phosphor being caused to emit light having a peak wavelength of 420 nm to 500 nm or less by the light-emitting body or light emitting source.

25. The light-emitting device according to claim 24, wherein the blue phosphor is selected from a group consisting of AlN:(Eu, Si) wherein both Eu and Si are present; $BaMgAl_{10}O_{17}$:Eu; $SrSi_9AL_{19}ON_{31}$:Eu; $LaSi_9Al_{19}N_{32}$:Eu; α-sialon:Ce; and JEM:Ce.

26. The light-emitting device according to claim 20, wherein the phosphor further comprises a green phosphor being caused to emit light having a peak wavelength of at least 500 nm and not exceeding 550 nm by the light-emitting body.

27. The light-emitting device according to claim 26, wherein the green phosphor is selected from a group consisting of α-sialon:Eu; $(Ba, Sr, Ca, Mg)_2SiO_4$:Eu wherein at least one of Ba, Sr, Ca, and Mg is present; and $(Ca, Sr, Ba)Si_2O_2N_2$:Eu wherein at least one of Ca, Sr, and Ba is present.

28. The light-emitting device according to claim 20, wherein the phosphor further comprises a yellow phosphor being caused to emit light having a peak wavelength of at least 550 nm and not exceeding 600 nm by the light-emitting body or light-emitting source.

29. The light-emitting device according to claim 28, wherein the yellow phosphor is selected from a group consisting of YAG:Ce; α-sialon:Eu; $CaAlSiN_3$:Ce; and $La_3Si_6N_{11}$:Ce.

30. The light-emitting device according to claim 20, wherein the phosphor further comprises a red phosphor being caused to emit light having a peak wavelength of at least 600 nm and not exceeding 700 nm by the light-emitting body or light-emitting source.

31. The light-emitting device according to claim 30, wherein the red phosphor is selected from a group consisting of $CaAlSiN_3$:Eu; $(Ca, Sr)AlSiN_3$:Eu wherein both Ca and Sr are present; $Ca_2Si_5N_8$:Eu; and $Sr_2Si_5N_8$:Eu.

32. An image display device comprising:
at least an excitation source and a phosphor,
wherein the phosphor comprises at least a phosphor recited in claim 1.

33. The image display device according to claim 32, wherein the image display device is any one of a fluorescent display tube (VFD), a field emission display (FED), a plasma display panel (PDP), a cathode-ray tube (CRT), and a liquid crystal display (LCD).

34. A pigment comprising an inorganic compound recited in claim 1.

35. An ultraviolet absorber comprising an inorganic compound recited in claim 1.

* * * * *